(12) United States Patent
Abrams et al.

(10) Patent No.: US 7,707,541 B2
(45) Date of Patent: *Apr. 27, 2010

(54) SYSTEMS, MASKS, AND METHODS FOR PHOTOLITHOGRAPHY

(75) Inventors: Daniel S. Abrams, Mountain View, CA (US); Stanley Osher, Pacific Palisades, CA (US); Danping Peng, Fremont, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 378 days.

This patent is subject to a terminal disclaimer.

(21) Appl. No.: 11/531,673

(22) Filed: Sep. 13, 2006

(65) Prior Publication Data

US 2007/0184357 A1    Aug. 9, 2007

Related U.S. Application Data

(60) Provisional application No. 60/775,991, filed on Sep. 13, 2005.

(51) Int. Cl.
*G06F 17/50* (2006.01)
*G06F 19/00* (2006.01)
*G21K 5/00* (2006.01)

(52) U.S. Cl. .................... 716/21; 700/120; 700/121; 378/35; 430/5

(58) Field of Classification Search .................. 716/21; 700/120, 121; 430/5; 378/35
See application file for complete search history.

(56) References Cited

U.S. PATENT DOCUMENTS 4,752,957 A * 6/1988 Maeda ...................... 704/204

5,242,770 A    9/1993 Chen et al.

(Continued)

FOREIGN PATENT DOCUMENTS

WO    WO 2006/078791 A2    7/2006

(Continued)

OTHER PUBLICATIONS

S. Osher and R. P. Fedkiw, "Level set methods: an overview and some recent results", J. Computational Physics, vol. 169, No. 2, pp. 463 May 20, 2001.

(Continued)

*Primary Examiner*—Phallaka Kik
(74) *Attorney, Agent, or Firm*—Wilson Sonsini Goodrich & Rosati

(57) ABSTRACT

A method for determining a mask pattern to be used on a photo-mask in a photolithographic process is described. During the method, a target pattern is partitioning into subsets, which are distributed to processors. Then, a set of second mask patterns, each of which corresponds to one of the subsets, is determined. Moreover, at least one of the second set of mask patterns may be determined by: providing a first mask pattern that includes distinct types of regions corresponding to distinct types of regions of the photo-mask, calculating a gradient of a function, and determining a second mask pattern based, at least in part, on the gradient. Note that the function may depend on the first mask pattern and an estimate of a wafer pattern that results from the photolithographic process, and that the gradient may be calculated in accordance with a formula obtained by taking a derivative of the function.

24 Claims, 34 Drawing Sheets

U.S. PATENT DOCUMENTS

| | | | |
|---|---|---|---|
| 5,301,101 A | 4/1994 | MacArthur et al. | |
| 5,418,092 A | 5/1995 | Okamoto | |
| 5,489,509 A | 2/1996 | Kawabata et al. | |
| 5,508,803 A | 4/1996 | Hibbs et al. | |
| 5,525,808 A | 6/1996 | Irie et al. | |
| 5,546,189 A | 8/1996 | Svetkoff et al. | |
| 5,546,225 A | 8/1996 | Shiraishi | |
| 5,640,199 A | 6/1997 | Garakani et al. | |
| 5,707,765 A | 1/1998 | Chen | |
| 5,889,678 A | 3/1999 | Inoue et al. | |
| 6,022,644 A | 2/2000 | Lin et al. | |
| 6,042,998 A | 3/2000 | Brueck et al. | |
| 6,096,567 A | 8/2000 | Kaplan et al. | |
| 6,123,733 A | 9/2000 | Dalton | |
| 6,383,847 B1 | 5/2002 | Ditlow et al. | |
| 6,468,711 B1 | 10/2002 | Sorori et al. | |
| 6,484,306 B1 | 11/2002 | Bokor et al. | |
| 6,563,566 B2 | 5/2003 | Rosenbluth et al. | |
| 6,596,466 B1 | 7/2003 | Pohland et al. | |
| 6,601,192 B1 | 7/2003 | Bowman-Amuah | |
| 6,611,627 B1* | 8/2003 | LaRossa et al. | 382/240 |
| 6,617,096 B2 | 9/2003 | Burkhard | |
| 6,677,948 B1 | 1/2004 | Wasserman et al. | |
| 6,698,007 B2 | 2/2004 | Wu et al. | |
| 6,703,170 B1 | 3/2004 | Pindo | |
| 6,704,920 B2 | 3/2004 | Brill et al. | |
| 6,733,929 B2 | 5/2004 | Pierrat | |
| 6,756,980 B2 | 6/2004 | Hayashi | |
| 6,764,795 B2 | 7/2004 | Aton et al. | |
| 6,787,271 B2 | 9/2004 | Cote | |
| 6,795,069 B2 | 9/2004 | Raskar et al. | |
| 6,798,412 B2 | 9/2004 | Cowperthwaite | |
| 6,799,313 B2 | 9/2004 | LaCour | |
| 6,809,797 B2 | 10/2004 | Baselmans et al. | |
| 6,880,135 B2 | 4/2005 | Chang et al. | |
| 6,968,532 B2 | 11/2005 | Sivakumar et al. | |
| 7,027,658 B2 | 4/2006 | Osher et al. | |
| 7,031,538 B2 | 4/2006 | Osher et al. | |
| 7,073,162 B2 | 7/2006 | Cobb et al. | |
| 7,124,394 B1 | 10/2006 | Abrams et al. | |
| 7,175,945 B2 | 2/2007 | Mieher et al. | |
| 7,178,127 B2 | 2/2007 | Abrams et al. | |
| 7,231,628 B2 | 6/2007 | Pack et al. | |
| 7,236,123 B2* | 6/2007 | Siegel | 342/159 |
| 7,302,090 B2 | 11/2007 | Kalus et al. | |
| 7,353,145 B2 | 4/2008 | Tanaka et al. | |
| 7,403,641 B2* | 7/2008 | Nakamoto et al. | 382/118 |
| 7,441,227 B2 | 1/2009 | Abrams et al. | |
| 7,480,889 B2 | 1/2009 | Abrams et al. | |
| 7,571,423 B2 | 8/2009 | Abrams et al. | |
| 2002/0028393 A1 | 3/2002 | Laidig et al. | |
| 2002/0066069 A1 | 5/2002 | Ashida et al. | |
| 2002/0177050 A1 | 11/2002 | Tanaka | |
| 2002/0188924 A1 | 12/2002 | Pierrat et al. | |
| 2003/0016864 A1* | 1/2003 | McGee et al. | 382/165 |
| 2003/0095267 A1 | 5/2003 | Mieher et al. | |
| 2003/0103189 A1 | 6/2003 | Neureuther et al. | |
| 2003/0106642 A1 | 6/2003 | Fairbairn et al. | |
| 2003/0123707 A1 | 7/2003 | Park | |
| 2003/0140330 A1 | 7/2003 | Tanaka et al. | |
| 2003/0152841 A1 | 8/2003 | Averbukh | |
| 2003/0165749 A1 | 9/2003 | Fritze et al. | |
| 2003/0198872 A1 | 10/2003 | Yamazoe et al. | |
| 2004/0008880 A1 | 1/2004 | Horie et al. | |
| 2004/0021660 A1 | 2/2004 | Ng-Thow-Hing et al. | |
| 2004/0031013 A1 | 2/2004 | Dulman et al. | |
| 2004/0073884 A1 | 4/2004 | Kroyan | |
| 2004/0086792 A1 | 5/2004 | Romeo et al. | |
| 2004/0101766 A1 | 5/2004 | Mesuda et al. | |
| 2004/0136587 A1 | 7/2004 | Kalus et al. | |
| 2004/0147121 A1 | 7/2004 | Nakagaki et al. | |
| 2004/0161678 A1 | 8/2004 | Misaka | |
| 2004/0166422 A1 | 8/2004 | Yamazoe et al. | |
| 2004/0214096 A1 | 10/2004 | Dulman et al. | |
| 2004/0229133 A1 | 11/2004 | Socha et al. | |
| 2004/0265707 A1 | 12/2004 | Socha | |
| 2005/0066300 A1 | 3/2005 | Zach | |
| 2005/0122500 A1 | 6/2005 | Ye et al. | |
| 2005/0136340 A1 | 6/2005 | Baselmans et al. | |
| 2005/0142470 A1 | 6/2005 | Socha et al. | |
| 2005/0147893 A1 | 7/2005 | Ogawa et al. | |
| 2005/0191566 A1 | 9/2005 | Liu et al. | |
| 2005/0265605 A1* | 12/2005 | Nakamoto et al. | 382/209 |
| 2006/0049978 A1* | 3/2006 | Siegel | 342/159 |
| 2006/0051682 A1 | 3/2006 | Hess et al. | |
| 2006/0172204 A1 | 8/2006 | Peng et al. | |
| 2006/0273242 A1 | 12/2006 | Hunsche et al. | |
| 2007/0009808 A1 | 1/2007 | Abrams et al. | |
| 2007/0011644 A1 | 1/2007 | Abrams et al. | |
| 2007/0011645 A1 | 1/2007 | Abrams et al. | |
| 2007/0011647 A1 | 1/2007 | Abrams et al. | |
| 2007/0011648 A1 | 1/2007 | Abrams et al. | |
| 2007/0133862 A1 | 6/2007 | Gold et al. | |
| 2007/0136716 A1 | 6/2007 | Abrams et al. | |
| 2007/0184369 A1 | 8/2007 | Abrams et al. | |
| 2007/0186206 A1 | 8/2007 | Abrams et al. | |
| 2007/0186208 A1 | 8/2007 | Abrams et al. | |
| 2007/0192756 A1 | 8/2007 | Abrams et al. | |
| 2007/0196742 A1 | 8/2007 | Abrams et al. | |
| 2007/0198963 A1 | 8/2007 | Granik et al. | |
| 2007/0198966 A1 | 8/2007 | Abrams et al. | |

FOREIGN PATENT DOCUMENTS

| | | |
|---|---|---|
| WO | WO 2006/078791 A3 | 7/2006 |
| WO | WO 2007/033362 A2 | 3/2007 |
| WO | WO 2007/033362 A3 | 3/2007 |
| WO | WO 2007/041600 A2 | 4/2007 |
| WO | WO 2007/041600 A3 | 4/2007 |
| WO | WO 2007/041602 A2 | 4/2007 |
| WO | WO 2007/041602 A3 | 4/2007 |
| WO | WO 2007/041701 A2 | 4/2007 |
| WO | WO 2007/041701 A3 | 4/2007 |
| WO | WO 2007/044557 A2 | 4/2007 |
| WO | WO 2007/044557 A3 | 4/2007 |
| WO | WO 2007/044630 A2 | 4/2007 |
| WO | WO 2007/044630 A3 | 4/2007 |
| WO | WO 2007/044827 A2 | 4/2007 |
| WO | WO 2007/044827 A3 | 4/2007 |

OTHER PUBLICATIONS

Nicolas Bailey Cobb, PhD Thesis, "Fast Optical and Process Proximity Correction Algorithms for Integrated Circuit Manufacturing", U.C. Berkeley, Spring 1998, 139 pages.

B.E.A. Saleh and S.I. Sayegh, "Reductions of errors of microphotographic reproductions by optical corrections of original masks", Optical Eng. vol. 20, No. 5 pp. 781-784 (1981).

K.M. Nashold and B.E.A. Saleh, "Image construction through diffraction-limited high-contrast imaging systems: an iterative approach", J. Opt. Soc. Am.A, vol. 2, No. 5 pp. 635-643 (1985).

Y. Liu and A. Zakhor, "Optimal binary image design for optical lithography", Proc. SPIE vol. 1264 pp. 401-412 (1990).

Y. Liu and A. Zakhor, "Binary and phase-shifting image design for optical lithography", Proc. SPIE vol. 1463 pp. 382-399 (1991).

A. Rosenbluth et al, "Optimum mask and source patterns to print a given shape", $JM^3$ vol. 1 No. 1 pp. 13-30(2002), Apr. 2002.

Y-T Wang, Y.C. Pati, H. Watanabe and T. Kailath, "Automated design of halftoned double-exposure phase-shifting masks", Proc. SPIE vol. 2440 pp. 290-301 (1995).

Y.H. Oh, and J-C Lee, "Resolution enhancement through optical proximity correction and stepper parameter optimization for 0.12-um mask pattern", Proc. SPIE vol. 3679 pp. 607-613 (1999).

J.A. Sethian and D. Adalsteinsson, "An overview of level set methods for etching, deposition, and lithography development", IEEE Trans. on Semiconductor Manufacturing, vol. 10, No. 1, pp. 167-184, Feb. 1997.

J.M. Berg and N. Zhou, "Shape-based optimization of a plasma etching process", 39th IEEE Conf. on Decision and Control, pp. 2023-2028 (Dec. 2000).

J.M. Geremia and H. Rabitz, "Optimal Hamiltonian identification: the synthesis of quantum optimal control and quantum inversion", J. Chem. Physics, vol. 118, No. 12 pp. 5369-5382 (Mar. 2003).

Sethian, J.A., "Level set methods and fast marching methods," 1999, Cambridge University Press, pp. 1-33.

Erdmann et al., Enhancements in Rigorous Simulation of Light Diffraction from Phase Shaft Masks, Mar. 2002, SPIE, vol. 4691, pp. 1156-1167.

Gordon et al., Lithography simulation employing rigorous solution of Maxwell's equations, Feb. 1998, SPIE, vol. 3334, pp. 176196.

Wong et al., Massively Parallel Electromagnetic Simulation for Photolithographic Applications, Oct. 1995, IEEE, vol. 14, pp. 1231-1240.

Sethian, J.A., "Level set methods and fast marching methods," 1999, Cambridge University Press, pp. 316-360 (printed from website http://math.berkeley.edu/~sethian/level_set.html).

Amendment and Response, filed Aug. 12, 2005, in Abrams, Daniel S., et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Office Action issued by U.S. Patent and Trademark Office, dated Feb. 14, 2005, in Abrams, Daniel et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Office Action issued by U.S. Patent and Trademark Office, mailed Mar. 8, 2005, in Abrams, Daniel S., et al., U.S. Appl. No. 10/408,924, "Optimized Photomasks for Photolithography," filed Apr. 6, 2003.

Reply to Office Action, mailed Sep. 8, 2005, in Abrams, Daniel S., et al., U.S. Appl. No. 10/408,924, "Optimized Photomasks for Photolithography," filed Apr. 6, 2003.

Office Action issued by U.S. Patent and Trademark Office, mailed Nov. 18, 2005, in Abrams, Daniel S., et al., U.S. Appl. No. 10/408,924, "Optimized Photomasks for Photolithography," filed Apr. 6, 2003.

Reply to Office Action, mailed May 18, 2006, in Abrams, Daniel S., et al., U.S. Appl. No. 10/408,924, "Optimized Photomasks for Photolithography," filed Apr. 6, 2003.

Office Action issued by U.S. Patent and Trademark Office, mailed Jul. 14, 2006, in Abrams, Daniel S., et al., U.S. Appl. No. 10/408,924, "Optimized Photomasks for Photolithography," filed Apr. 6, 2003.

Reply to Office Action, mailed Jan. 16, 2007, in Abrams, Daniel S., et al., U.S. Appl. No. 10/408,924, "Optimized Photomasks for Photolithography," filed Apr. 6, 2003.

Office Action issued by U.S. Patent and Trademark Office, mailed Jun. 20, 2007, in Abrams, Daniel S., et al., U.S. Appl. No. 10/408,924, "Optimized Photomasks for Photolithography," filed Apr. 6, 2003.

Office Action issued by U.S. Patent and Trademark Office, mailed Sep. 25, 2007, in Abrams, Daniel S., et al., U.S. Appl. No. 11/549,846, "Method for Time-Evolving Rectilinear Contours Representing Photo Masks." filed Oct. 16, 2006.

Khan, M. et al, "A Semi-Empirical Resist Dissolution Model for Sub-micron Lithographies", pp. 41-46, by Technical Proceedings of the 1998 International Conference on Modeling and Simulation of Microsystems, 1998, pp. 41-46.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Abrams, Daniel et al., "Technique for Determining a Mask Pattern Corresponding to a Photomask," Nonfinal Office Action mailed May 28, 2009, in U.S. Appl. No. 11/674,130, filed Feb. 12, 2007.

Abrams, Daniel et al., "Method for Time-Evolving Rectilinear Contours Representing Photo Masks," Response to Restriction Requirement filed Jun. 15, 2009, in U.S. Appl. No. 11/674,133, filed Feb. 12, 2007.

Abrams, Daniel et al., "Optimized Photomasks for Photolithography," Nonfinal Office Action mailed Apr. 21, 2008, in U.S. Appl. No. 11/225,378, filed Sep. 12, 2005, issued as U.S. Patent 7,571,423.

Abrams, Daniel et al., "Lithography Verification Using Guard Bands," Nonfinal Office Action mailed Oct. 27, 2008, in U.S. Appl. No. 11/538,290, filed Oct. 3, 2006.

Abrams, Daniel et al., "Lithography Verification Using Guard Bands," Final Office Action mailed Jul. 7, 2009, in U.S. Appl. No. 11/538,290, filed Oct. 3, 2006.

Abrams, Daniel et al., "Lithography Verification Using Guard Bands," Response to Office Action filed Apr. 14, 2009, in U.S. Appl. No. 11/538,290, filed Oct. 3, 2006.

Abrams, Daniel et al., "Lithography Verification Using Guard Bands," Response to Office Action Nov. 9, 2009, in U.S. Appl. No. 11/538,290, filed Oct. 3, 2006.

Abrams, Daniel et al., "Mask-Pattern Determination using Topology Types," Nonfinal Office Action mailed Sept. 8, 2009, in U.S. Appl. No. 11/538,420, filed Oct. 3, 2006.

Peng, Danping et al., "Systems, Masks and Methods for Printing Contact Holes and Other Patterns," Nonfinal Office Action mailed Aug. 13, 2008, in U.S. Appl. No. 11/335,018, filed Jan. 18, 2006.

Abrams, Daniel et al., "Mask-Patterns Including Intentional Breaks," Nonfinal Office Action mailed Sep. 19, 2008, in U.S. Appl. No. 11/538,782, filed Oct. 4, 2006.

Abrams, Daniel et al., "Mask-Patterns Including Intentional Breaks," Nonfinal Office Action mailed Jul. 7, 2009, in U.S. Appl. No. 11/538,782, filed Oct. 4, 2006.

Abrams, Daniel et al., "Mask-Patterns Including Intentional Breaks," Response to Office Action filed Jan. 28, 2009, in U.S. Appl. No. 11/538,782, filed Oct. 4, 2006.

Abrams, Daniel et al., "Mask-Patterns Including Intentional Breaks," Response to Office Action filed Nov. 9, 2009, in U.S. Appl. No. 11/538,782, filed Oct 4, 2006.

Abrams, Daniel et al., "Systems, Masks, and Methods for Manufacturable Masks," Nonfinal Office Action mailed Apr. 2, 2009, in U.S. Appl. No. 11/245,691, filed Oct. 6, 2005.

Abrams, Daniel et al., "Systems, Masks, and Methods for Manufacturable Masks," Response to Office Action filed Jul. 29, 2009, in U.S. Appl. No. 11/245,691, filed Oct. 6, 2005.

Abrams, Daniel et al., "Systems, Masks, and Methods for Photomasks Optimized with Approximate and Accurate Merit Functions," Nonfinal Office Action mailed May 11, 2009, in U.S. Appl. No. 11/539,601, filed Oct. 6, 2005.

Abrams, Daniel et al., "Systems, Masks, and Methods for Photomasks Optimized with Approximate and Accurate Merit Functions," Response to Office Action filed Nov. 9, 2009, in U.S. Appl. No. 11/539,601, filed Oct. 6, 2005.

Abrams, Daniel et al., "Fast Systems and Methods for Calculating Electromagnetic Fields Near Photomasks," Nonfinal Office Action mailed Feb. 13, 2007, in U.S. Appl. No. 11/245,714, filed Oct. 6, 2005, now abandoned.

Peng, Danping et al., "Physical-Resist Model Using Fast Sweeping," Nonfinal Office Action mailed Oct. 13, 2009, in U.S. Appl. No. 11/773,923, filed Jul. 5, 2007.

Abrams, Daniel S., et al., "Optimized Photomasks for Photolithography," Final Office Action mailed Mar. 20, 2008, in U.S. Appl. No. 10/408,924, filed Apr. 6, 2003, now issued as U.S. Patent 7,480,889.

Abrams, Daniel et al., "Technique for Determining a Mask Pattern Corresponding to a Photomask," Response to Nonfinal Office Action filed Aug. 27, 2009, in U.S. Appl. No. 11/674,130, filed Feb. 12, 2007.

Abrams, Daniel et al., "Method for Time-Evolving Rectilinear Contours Representing Photo Masks," Notice of Allowance mailed Sept 22, 2009, 2009, in U.S. Appl. No. 11/674,133, filed Feb. 12, 2007.

Abrams, Daniel et al., "Method for Time-Evolving Rectilinear Contours Representing Photo Masks," Restriction Requirement mailed Jan. 14, 2009, in U.S. Appl. No. 11/674,133, filed Feb. 12, 2007.

Amendment and Response, filed Aug. 12, 2005, in Abrams, Daniel S., et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Abrams, Daniel et al., "Method for Time-Evolving Rectilinear Contours Representing Photo Masks," Notice of Allowance issued by U.S. Patent and Trademark Office, dated Jun. 6, 2008, in U.S. Appl. No. 11/549,846, filed Oct. 16, 2006, now issued as U.S. Patent 7,441,227.

Abrams, Daniel et al., "Systems, Masks, and Methods for Manufacturable Masks," Notice of Allowance mailed Nov. 30, 2009, in U.S. Appl. No. 11/245,691, filed Oct. 6, 2005.

Abrams, Daniel et al., "Technique for Determining a Mask Pattern Corresponding to a Photomask," Notice of Allowance mailed Dec. 14, 2009, in U.S. Appl. No. 11/674,130, filed Feb. 12, 2007.

Abrams, Daniel et al., "Lithography Verification Using Guard Bands," Notice of Allowance mailed Dec. 28, 2009, in U.S. Appl. No. 11/538,290, filed Oct. 3, 2006.

Abrams, Daniel et al., "Systems, Masks, and Methods for Photomasks Optimized with Approximate and Accurate Merit Functions," Notice of Allowance mailed Jan. 11, 2010, in U.S. Appl. No. 11/539,601, filed Oct. 6, 2005.

Abrams, Daniel et al., "Mask-Patterns Including Intentional Breaks," Notice of Allowance mailed Jan. 29, 2010, in U.S. Appl. No. 11/538,782, filed Oct. 4, 2006.

Abrams, Daniel et al., "Method for Time-Evolving Rectilinear Contours Representing Photo Masks," Office Action mailed Nov. 23, 2009, in U.S. Appl. No. 11/674,133, filed Feb. 12, 2007.

Abrams, Daniel et al., "Method for Time-Evolving Rectilinear Contours Representing Photo Masks," Response to Nonfinal Office Action dated Jan. 7, 2010, in U.S. Appl. No. 11/674,133, filed Feb. 12, 2007.

Abrams, Daniel et al., "Mask-Pattern Determination using Topology Types," Response to Nonfinal Office Action dated Jan. 7, 2010, in U.S. Appl. No. 11/538,420, filed Oct, 3, 2006.

Abrams, Daniel et al., "Mask-Pattern Determination using Topology Types," Final Office Action mailed Feb. 17, 2010, in U.S. Appl. No. 11/538,420, filed Oct. 3, 2006.

\* cited by examiner

Wafer Pattern 1004

Wafer pattern 1007

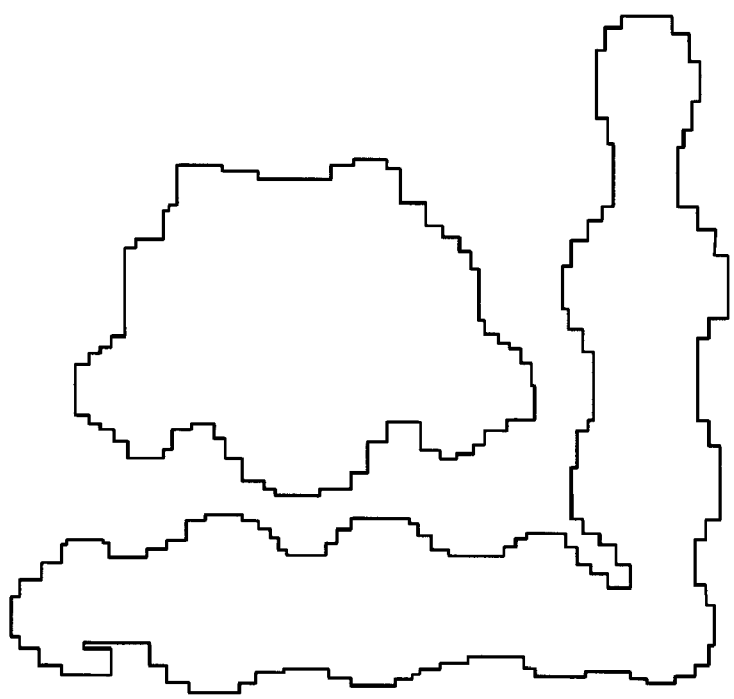

SYSTEMS, MASKS, AND METHODS FOR PHOTOLITHOGRAPHY

CROSS-REFERENCE

This application claims the benefit of U.S. Provisional Application No. 60/775,991, filed Sep. 13, 2005, which is incorporated herein by reference in its entirety.

This application is related to U.S. patent application Ser. No. 11/674,130, filed on Feb. 12, 2007, to U.S. patent application Ser. No. 11/674,133, filed on Feb. 12, 2007, to U.S. patent application Ser. No. 11/549,846, now U.S. Pat. No. 7,441,227, filed on Oct. 16, 2006, to U.S. patent application Ser. No. 11/539,601, filed on Oct. 6, 2006, to U.S. patent application Ser. No. 11/538,782, filed on Oct. 4, 2006, to U.S. patent application Ser. No. 11/538,290, filed on Oct. 3, 2006, to U.S. patent application Ser. No. 11/538,420, filed on Oct. 3, 2006, to U.S. patent application Ser. No. 11/245,691, filed on Oct. 6, 2005, to U.S. patent application Ser. No. 11/225,378, now U.S. Pat. No. 7,571,423, filed on Sep. 12, 2005, and to U.S. patent application Ser. No. 10/408,924, now U.S. Pat. No. 7,480,889, filed Apr. 6, 2003.

BACKGROUND OF THE INVENTION

1. Field of Invention

Field relates to masks, also known as photomasks, used in photolithography processes and, more particularly, to a method for finding the optimal photomask pattern to allow for production of wafer patterns with minimal distortions or artifacts and to allow for the ability to constrain resulting contours to rectilinear patterns.

2. Description of Related Art

Lithography processing represents an essential technology for manufacturing Integrated Circuits (IC) and Micro Electro-Mechanical Systems (MEMS). Lithographic techniques are used to define patterns, geometries, features, shapes, et al ("patterns") onto an integrated circuit die or semiconductor wafer or chips where the patterns are typically defined by a set of contours, lines, boundaries, edges, curves, et al ("contours"), which generally surround, enclose, and/or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photomask patterns and are accompanied by unwanted distortions and artifacts.

Techniques such as Optical Proximity Correction (OPC) attempt to solve this problem by appropriate pre-distortion of the photomask pattern. However, such approaches do not consider the full spectrum of possible photomask patterns, and therefore result in sub-optimal designs. The resulting patterns may not print correctly at all, or may not print robustly. Accordingly, there is a need for systems and methods for generating the optimal photomask patterns which result in the robust production of wafer patterns faithful to their target patterns.

SUMMARY OF THE INVENTION

An aspect of the present invention may provide a method for determining a photomask pattern optimized for use in producing a pattern on a workpiece, such as a semiconductor wafer, drive head, optical component or other objects. The pattern may be optimized relative to a desired target pattern using a merit function.

Aspects may provide for initial photomask patterns or target patterns to be provided in a hierarchical polygon representation, such as GDSII or Oasis, and for the output photomask pattern to be provided in a hierarchical polygon representation, such as GDSII or Oasis. Aspects may provide for any of the above patterns to be converted between a polygonal representation and a functional representation of all or a portion of the pattern.

Aspects may provide for all or a portion of any of the above patterns to be represented using mask functions. In an example embodiment, a two dimensional function may be used to represent a contour. For example, the function may be a distance function with values representing the distance to a contour of the pattern. In some examples, the function may be a level set function.

Aspects may provide for the representation to be stored as function values at points across the surface of all or a portion of the photomask pattern, such as a grid of points. For example, the representation may be stored as an array in memory. Aspects may provide for function values with more than three output values or ranges of output values representing different regions of a photomask pattern. For example, the function values may be used to indicate the position of a contour with higher resolution than the grid size, such as when the contour falls in between grid points at which the function is evaluated.

Aspects may provide for a photomask pattern or target pattern to be divided into blocks for processing. For example, a polygon representation may be divided into blocks. For example, a block size of 1 micron by 1 micron up to 10 microns by 10 microns or more may be used, or any range subsumed therein, although this may be varied depending upon the size of repetitive structures or other design features in the pattern. Aspects may provide for overlapping halo regions to be included in the blocks. For example, the halo regions may be determined based on the wavelength of light used for photolithography, such as 193 nm wavelength or other wavelength light. For example, the halo region may provide for an overlap in each direction on the order of a few wavelengths. In some embodiments, the overlap in each direction may be within the range of 0.5 to 2 microns or any range subsumed therein. In some embodiments, the distance for the halo region may be in the range of 5% to 10% of the width or height of the block or any range subsumed therein. The foregoing are examples and other ranges may be used in other embodiments. In example embodiments, a photomask pattern may have more than a million, or even more than ten million gates, and may be divided into more than a million blocks.

Aspects may provide for blocks to be converted from polygonal representation to function representation for optimization. Aspects may provide for a functional representation of all or a part of a pattern to be used in evaluating a merit function or an aspect of a merit function, such as a derivative or gradient of a merit function. A change function may be determined and added to the functional representation of the pattern. For example, the change function may provide a small change value to be added to the functional representation at each grid point for all or a part of the pattern. Aspects may provide for the function to be modified iteratively. Aspects may provide for regularization or rectilinear projection for each iteration or periodically for selected iterations or at the end when the final mask pattern is selected. Aspects may provide for iteration to be continued until a desired threshold is reached with respect to a merit function, until the change function is sufficiently small, until a desired number of iterations is performed or some combination of these or other criteria.

Aspects may provide for blocks to be processed using any of the methods described above. In some embodiments, blocks may be processed in parallel using multiple processors, blades or accelerator cards. Aspects may provide for the blocks to be combined after processing to provide a mask pattern for an entire layer of a semiconductor device or other workpiece. These aspects may provide for efficient full chip optimization.

Aspects may provide a method of manufacturing a photomask in accordance with a photomask pattern determined by any of the above methods. Aspects may provide a photomask with a pattern determined by any of the above methods.

Aspects may provide a method of manufacturing a semiconductor wafer or integrated circuit device using any of the above photomasks. Aspects may provide for developing a pattern in photoresist on a semiconductor wafer or other workpiece using any of the above masks, as well as etching, doping or depositing materials based in such regions to form integrated circuits or other structures. Aspects may provide for such wafers or other workpieces to be scribed into die and packaged to form integrated circuit devices or other devices. Aspects may provide for a semiconductor wafer or integrated circuit device manufactured using any of the above methods or photomasks.

Aspects may provide a design file or data structure in memory storing any of the above representations of a pattern.

Aspects may provide a computer readable medium with instructions for any of the methods or method steps described above or for storing or processing any of the patterns, representations, files or data structures described above.

Aspects may provide a computer system with a processor for executing instructions for any of the methods or method steps described above and for storing or processing any of the patterns, representations, files or data structures described above. In some embodiments, the computer system may include one or more of a processor, accelerator board, memory, storage and a network interface. Aspects may provide for any of the patterns, representations, files or data structures described above to be stored in memory or storage and processed by one or more processors or accelerators in accordance with any of the method or method steps described above. Aspects may provide for a system with a plurality of computer systems, server blades, processors or accelerators to process all or portions of a photomask pattern in parallel or in blocks as described above, which may include overlapping halo regions. Aspects may provide for an initial computer system or processor to divide a photomask pattern or design file into blocks as described above for parallel processing and to combine the processed blocks to generate a photomask pattern or design file for a mask pattern for an entire layer of a semiconductor device or other workpiece.

It is understood that each of the above aspects of the invention may be used alone or in any combination with one or more of the other aspects of the invention. The above aspects are examples only and are not intended to limit the description or claims set forth below.

BRIEF DESCRIPTION OF THE DRAWINGS

FIG. 10g is a diagram illustrating a rectilinear photomask pattern output by the algorithm based on the initial photomask shown in FIG. 6, according to an embodiment of the present invention.

DETAILED DESCRIPTION

As understood herein, the term "wafer pattern" is understood to include any polygon (rectilinear or non-rectilinear) or other shape or pattern to be formed on a semiconductor or other material substrate, for example digital or analog circuit structures or interconnect.

Figure 1:
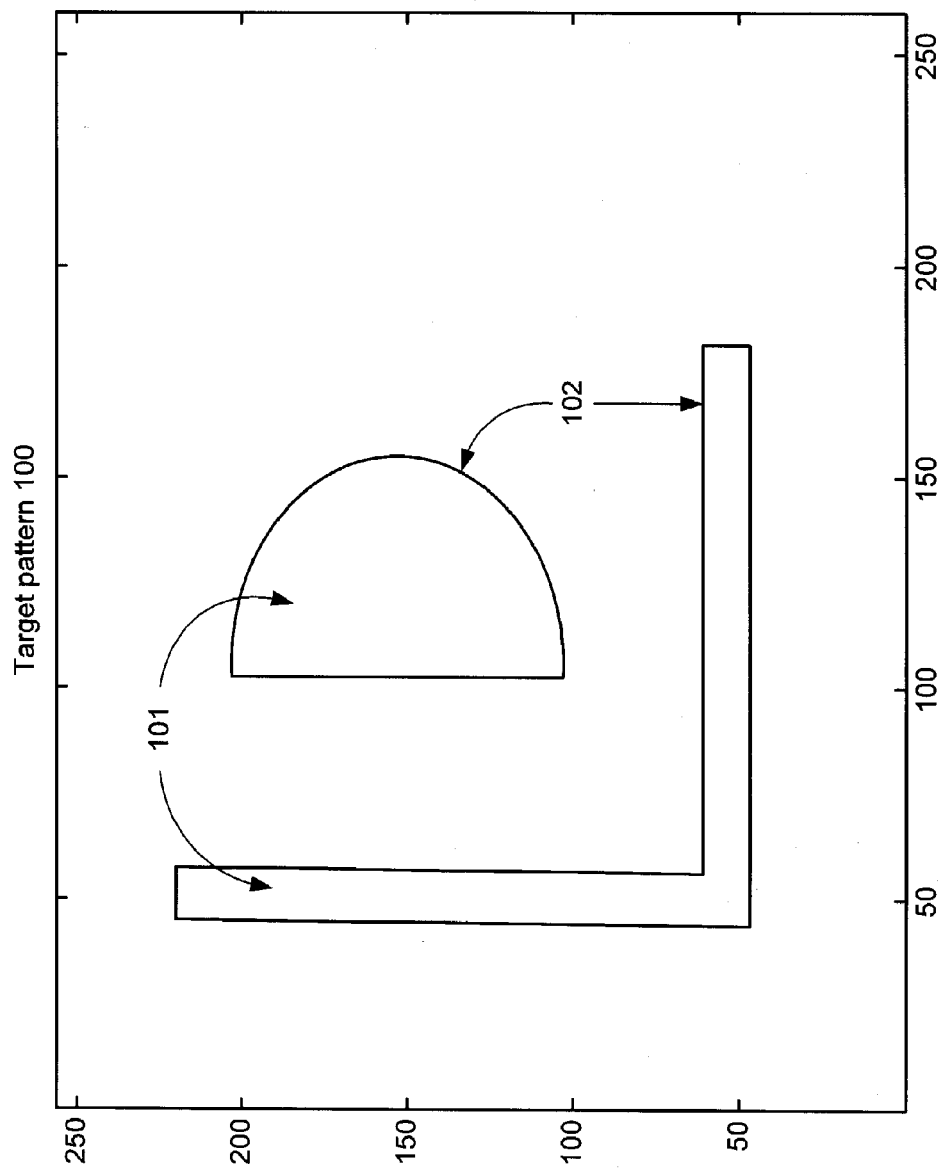
FIG. 1 is a diagram illustrating a simple example target pattern to be printed on a wafer using a photolithography process, according to an embodiment of the present invention.

FIG. 1 is a diagram illustrating an example target pattern 100 to be printed on a wafer using a photolithography process. Target pattern 100 comprises regions 101 enclosed by contours 102. In an example embodiment, areas within regions 101 represent photoresist and the area outside regions 101 represents the absence of photoresist.

Figure 2:
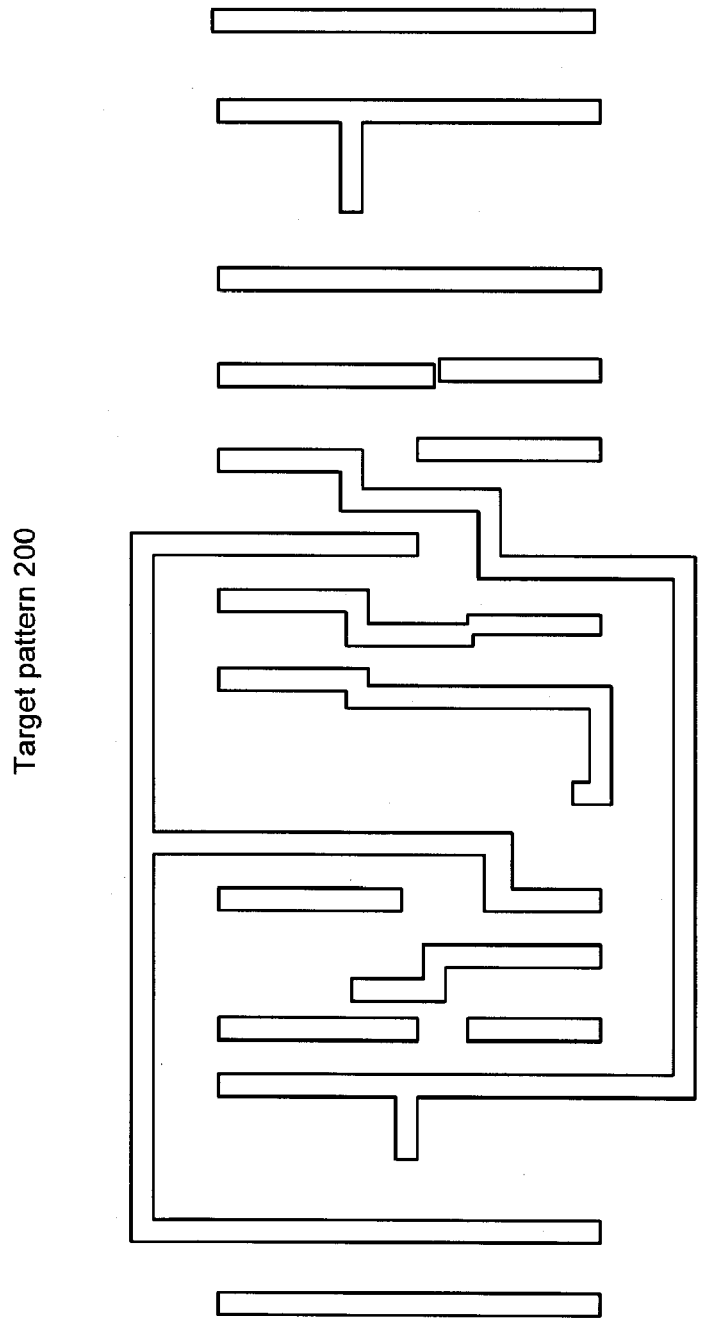
FIG. 2 is a diagram illustrating a more complex example target pattern to be printed on a wafer using a photolithography process, according to an embodiment of the present invention.

FIG. 2 is a diagram illustrating a more complex example target pattern 200 to be printed on a wafer using a photolithography process. The complexity of target pattern 200 is more illustrative of a pattern for representing an integrated circuit design.

Figure 3:
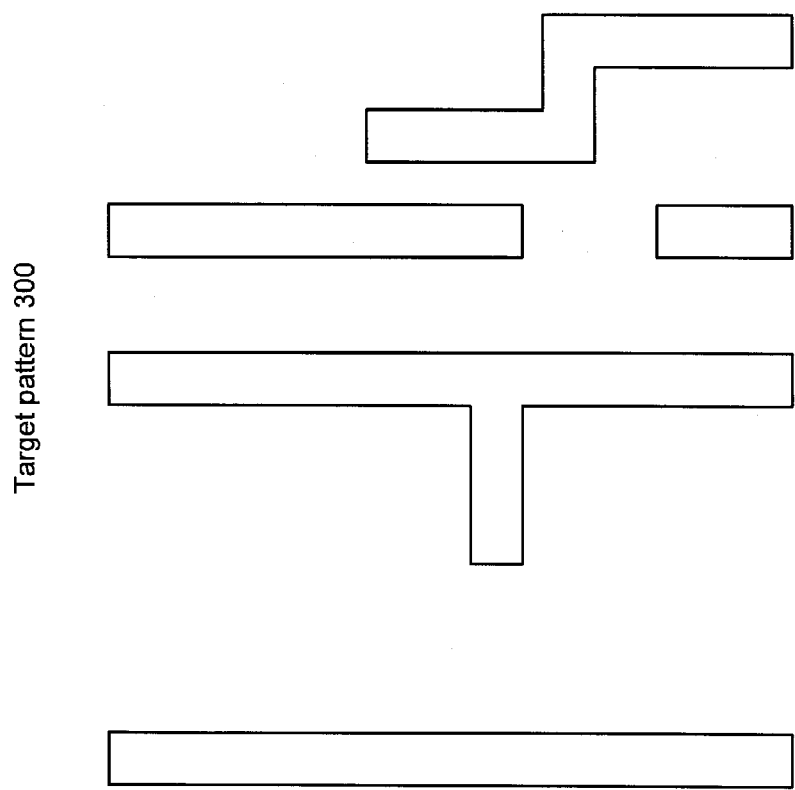
FIG. 3 is a diagram illustrating a detail from the example target pattern of FIG. 2 to be printed on a wafer using a photolithography process, according to an embodiment of the present invention.

FIG. 3 is a diagram illustrating a detail target pattern 300 from the example target pattern 200 of FIG. 2 to be printed on a wafer using a photolithography process, according to an embodiment of the present invention.

Figure 4:
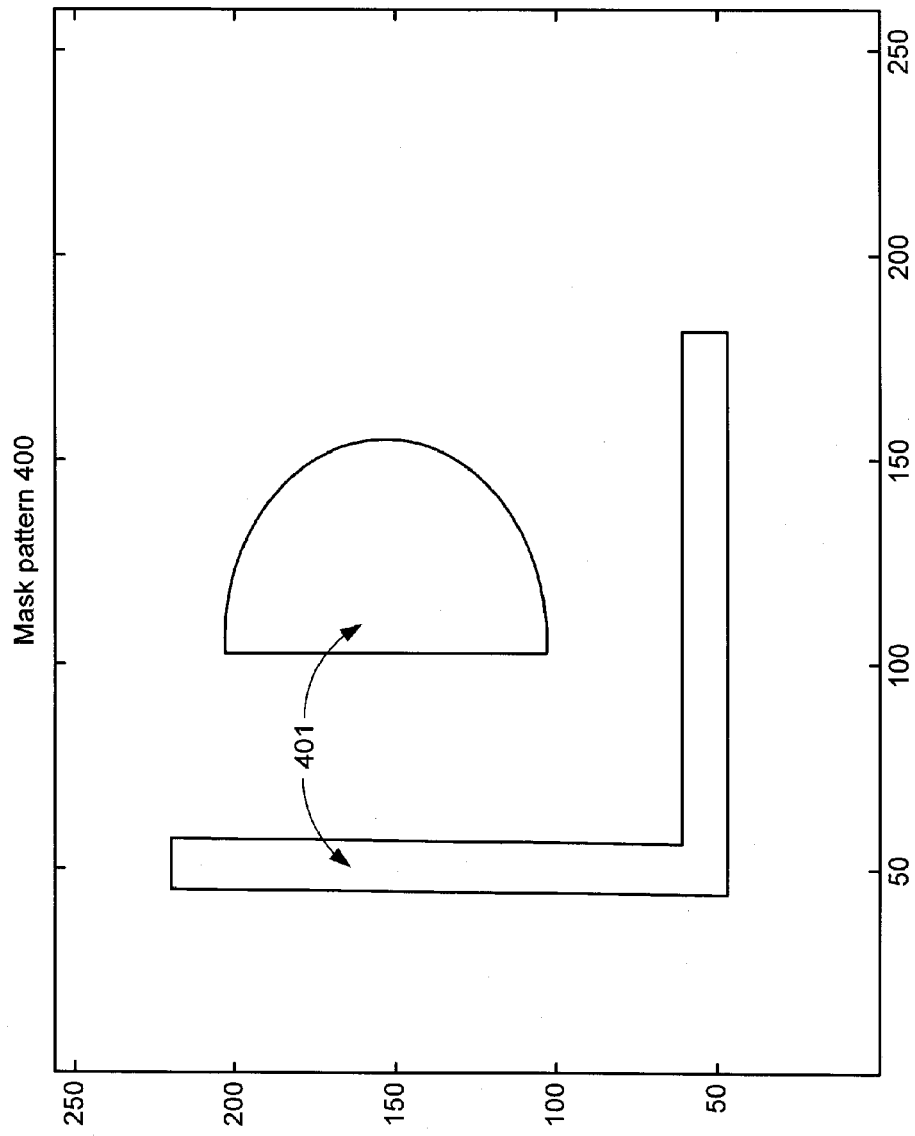
FIG. 4 is a diagram illustrating an example photomask pattern in the (x,y) plane comprising regions, according to an embodiment of the present invention.

FIG. 4 is a diagram illustrating an example photomask pattern 400 in the (x, y) plane comprising regions 401 for printing a wafer pattern in a photolithography process. In an embodiment, an area within a region 401 represents chrome and the area outside regions 401 represents glass on the photomask. Alternatively, an area within a region 401 represents a material other than chrome and the area outside regions 401 represents a material other than glass on the photomask.

Figure 5:
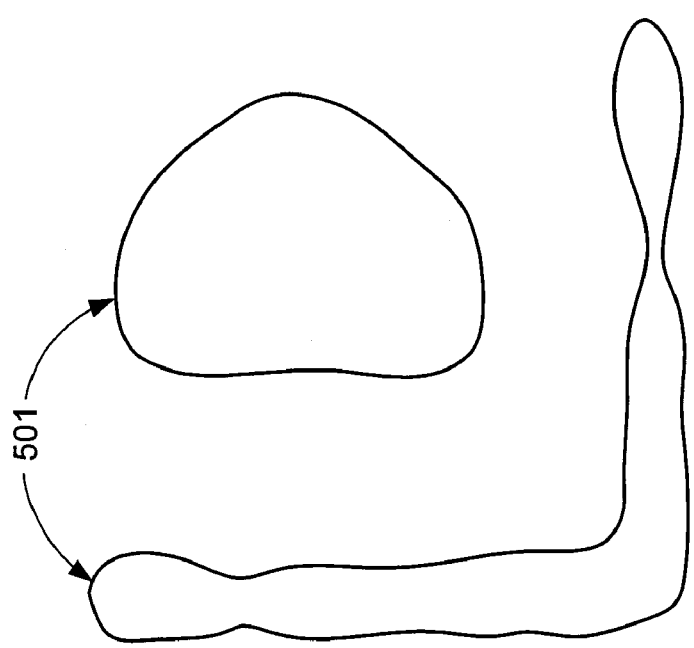
FIG. 5 is a diagram showing an example wafer pattern illustrative of what might print on a wafer using the example photomask pattern of FIG. 4 in a photolithography process, according to an embodiment of the present invention.
Figure 6:
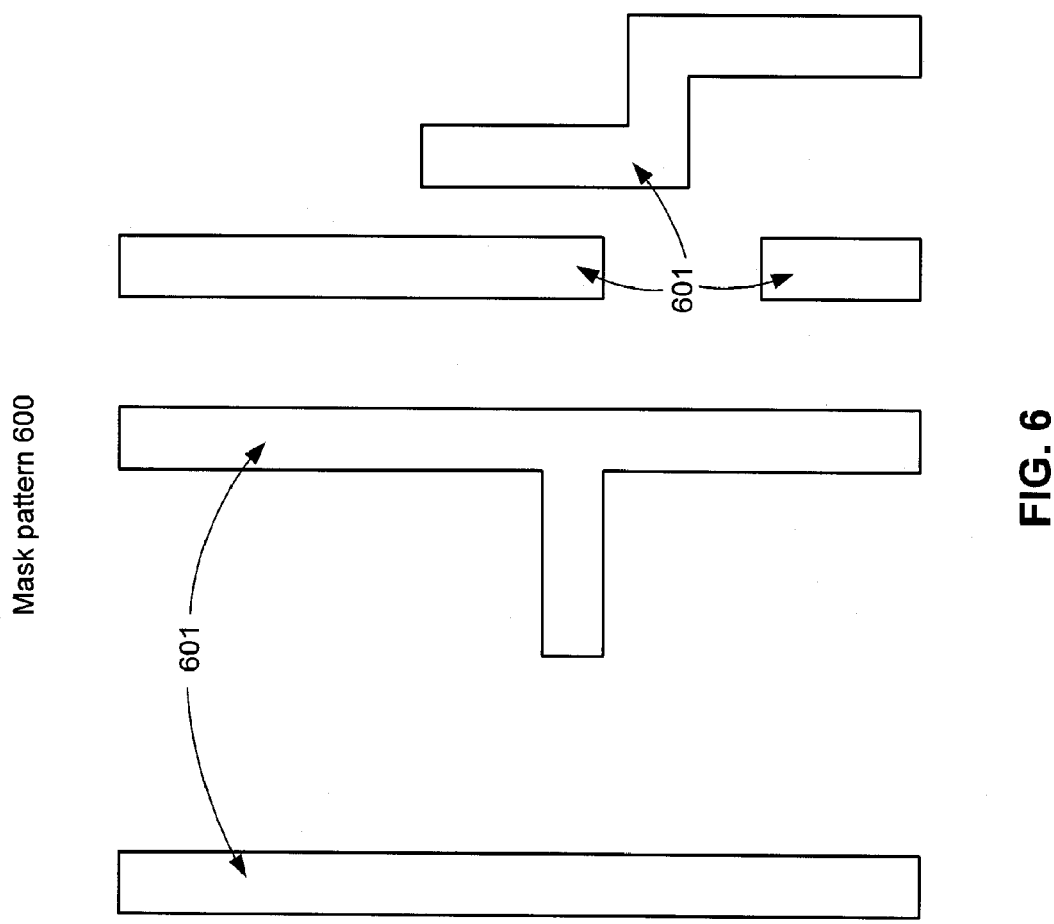
FIG. 6 is a diagram illustrating a more complex example photomask pattern comprising regions, according to an embodiment of the present invention.
Figure 7:
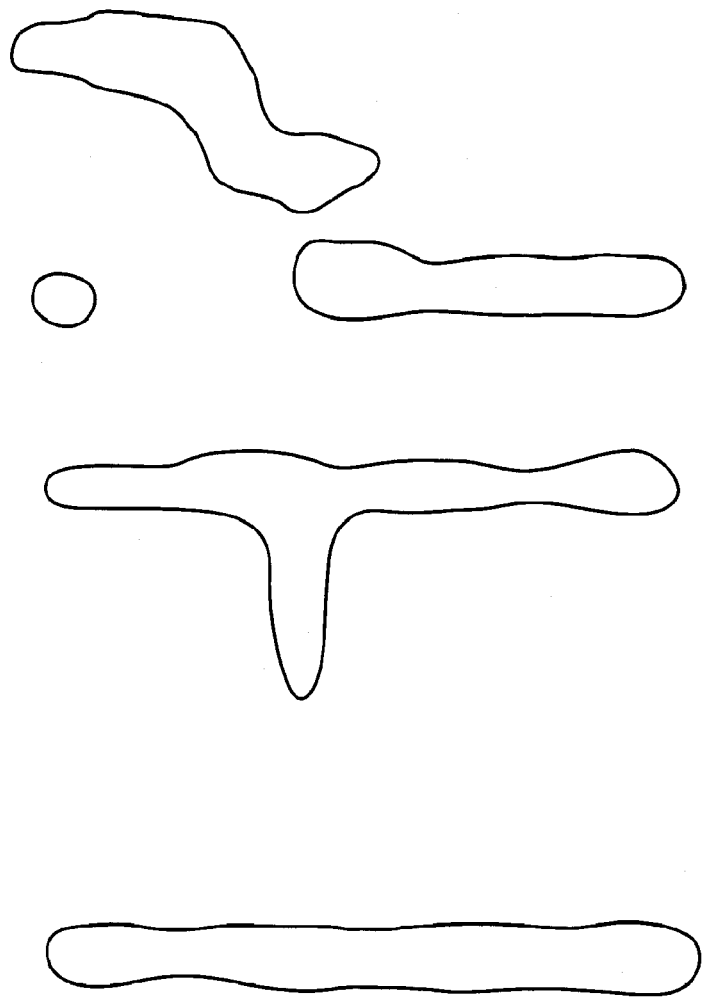
FIG. 7 is a diagram showing an example wafer pattern illustrative of what might print on a wafer using the example photomask pattern of FIG. 6 in a photolithography process, according to an embodiment of the present invention.

FIG. 5 is a diagram showing an example wafer pattern 500 illustrative of what might print on a wafer using photomask pattern 400 in a photolithography process. In an example embodiment, areas within regions 501 represent photoresist and the area outside regions 501 represents the absence of photoresist. Note that wafer pattern 500 differs from target pattern 100 due to distortions and artifacts produced by the photolithography process. FIG. 6 is a diagram illustrating a more complex example photomask pattern 600 comprising regions, according to an embodiment of the present invention. FIG. 7 is a diagram showing an example wafer pattern 700 illustrative of what might print on a wafer using the example photomask pattern 600 of FIG. 6 in a photolithography process, according to an embodiment of the present invention. Example embodiments may generate a photomask pattern which, when used in a photolithography process, produces a wafer pattern more faithful to the corresponding target pattern, the wafer pattern having fewer undesirable distortions and artifacts.

Figure 8A:
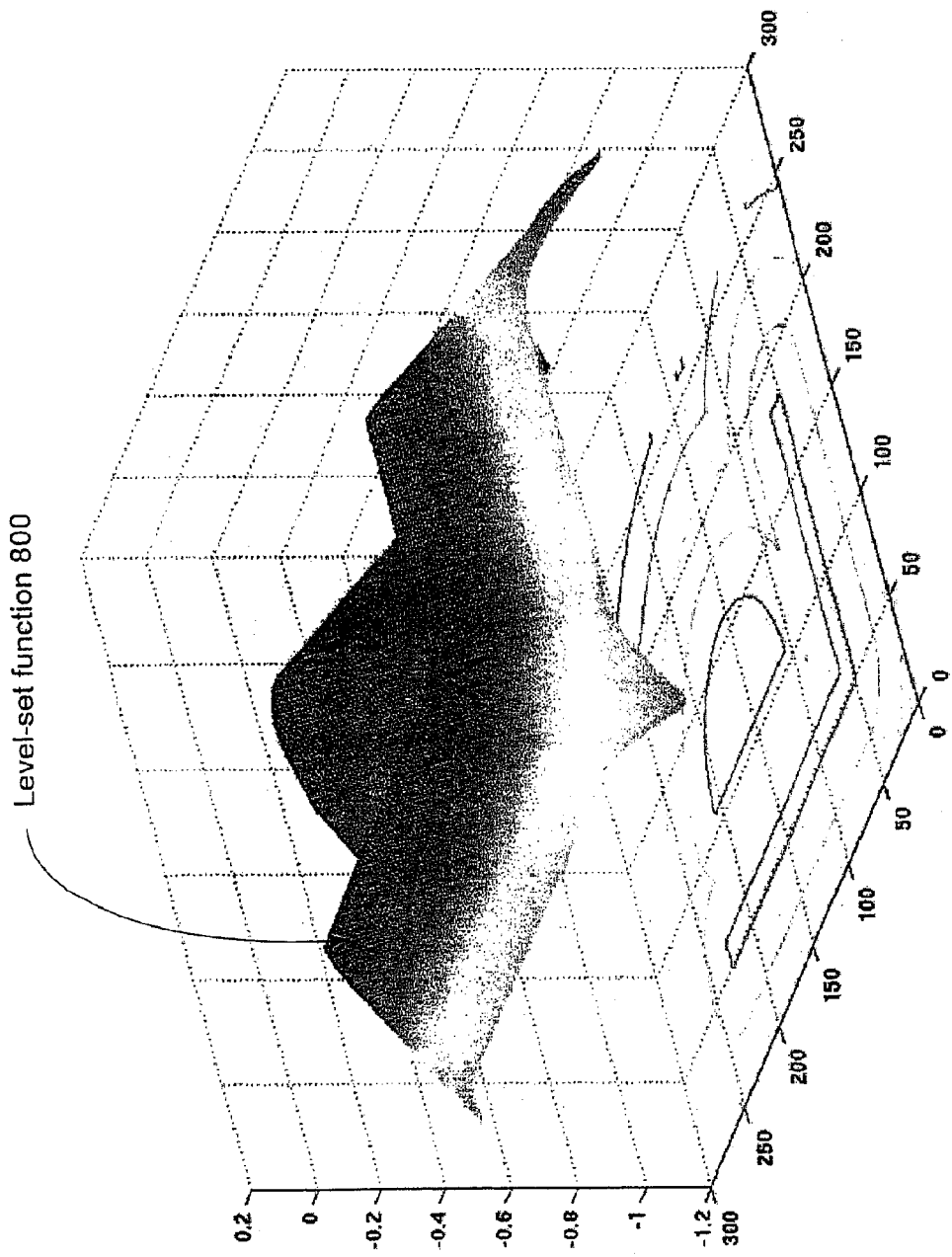
FIG. 8a is a diagram illustrating a function representing the example photomask pattern of FIG. 4 by defining the contours which enclose the regions in the photomask pattern, according to an embodiment of the present invention.
Figure 8B:
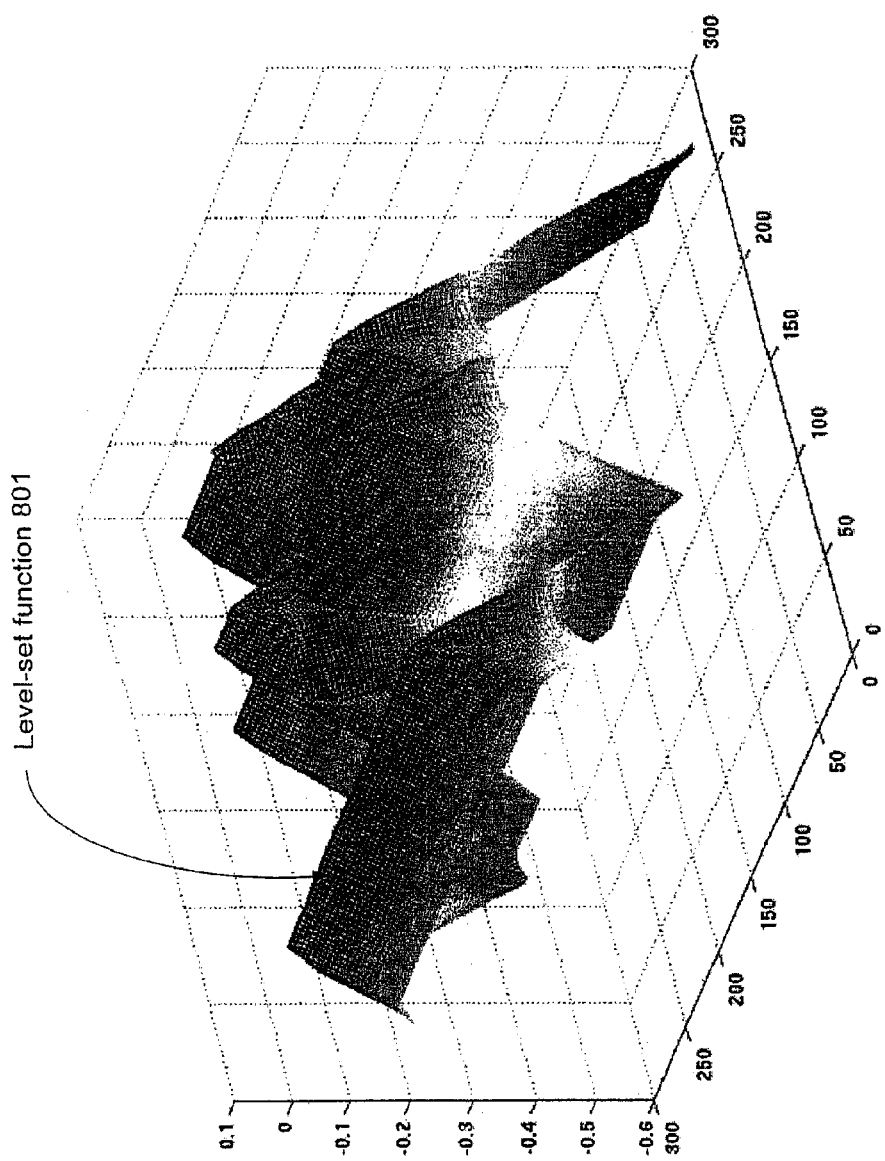
FIG. 8b is a diagram illustrating the function representing the example photomask pattern of FIG. 6 by defining the contours which enclose the regions in the photomask pattern, according to an embodiment of the present invention.

Because we use contours to define regions in a photomask pattern, we use a mathematical description of such contours. FIG. 8a illustrates a function $\psi(x, y)$ 800 representing example photomask pattern 400 by defining the contours which enclose the regions in photomask pattern 400. FIG. 8b is a diagram illustrating a function $\psi(x, y)$ 801 representing the example photomask pattern 600 of FIG. 6 by defining the contours which enclose the regions in the photomask pattern 600. $\psi(x, y)$ can be a function which defines the contours implicitly in the sense that a two dimensional function is used to describe a set of contours. Frequently, the function $\psi(x, y)$ is thought of as a real-valued function that defines the contour according to the value of the function along the contour. For example, in one embodiment the mask function $\psi(x, y)$ has the property that $\psi(x, y)$ 1. $\psi(x, y)=0$ everywhere along the boundary of a region;
2. $\psi(x, y)>0$ "inside" a region (for example, those regions corresponding to the chrome portions of the mask);
3. $\psi(x, y)<0$, or is negative "outside" a region (for example, those regions corresponding to the clear quartz portions of the mask).

Figure 8C:
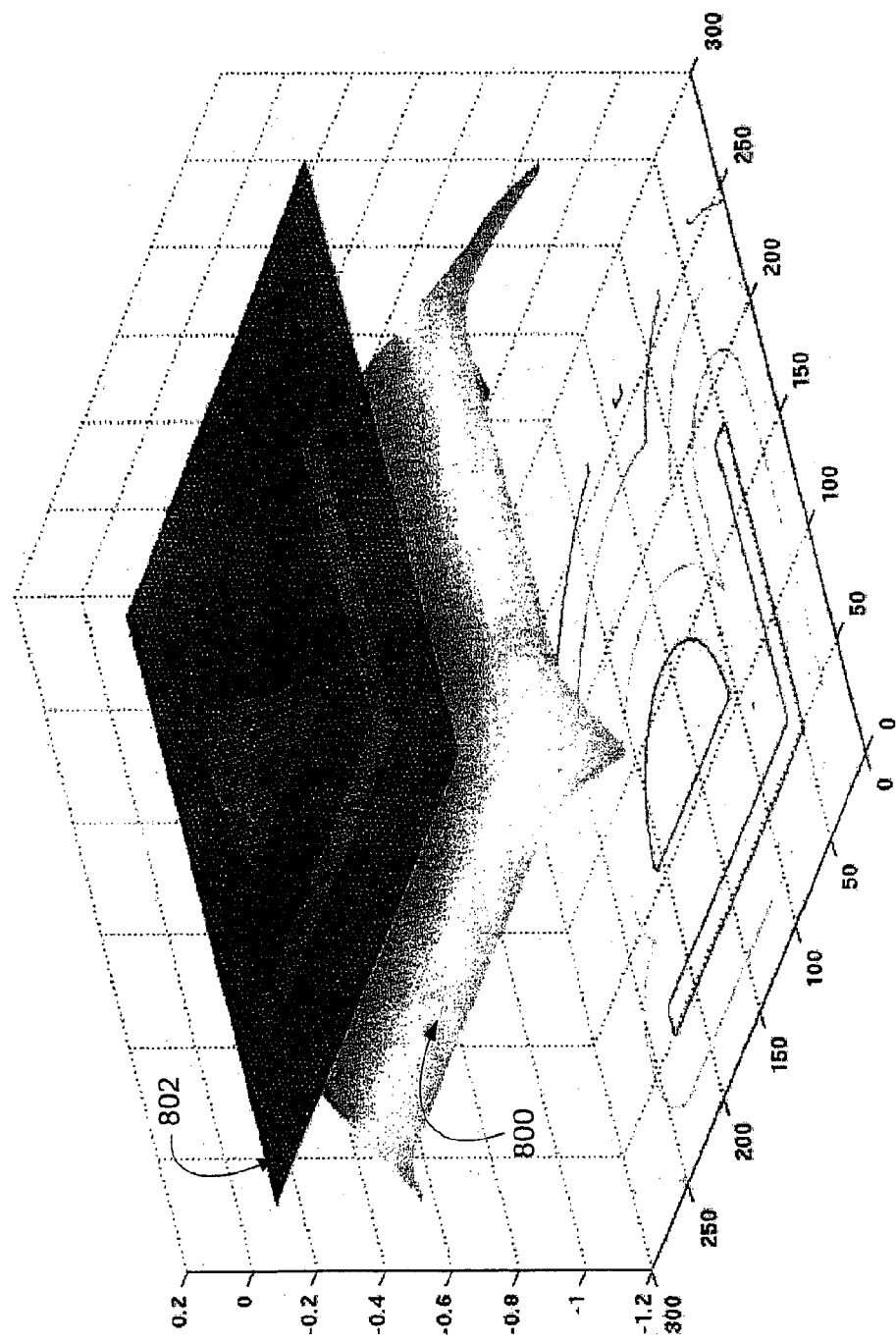
FIG. 8c is a diagram illustrating the function of FIG. 8a intersected with the zero plane parallel to the (x,y) plane, according to an embodiment of the present invention.

In this case, the contours are defined by the "level-set", i.e. those values in the (x,y) plane such that $\psi(x, y)=0$. FIG. 8c illustrates the level-set by intersecting the level-set function 800 with the zero plane 802 parallel to the (x,y) plane. We may also call such a representation of a photomask an area based representation, and in some embodiments, a pixel based representation.

In other embodiments, a variety of functional representation of the photomask, other than that described above, can be used to represent a photomask, and would fall under the scope of this invention. We call a two dimensional function that defines the photomask contours a photomask function or mask function.

It is an aspect of the present invention to, given a target pattern, find a function $\psi(x, y)$ such that $\psi(x, y)=0$ defines a set of contours, which, when interpreted as the boundaries of regions of a pattern on a photomask, correspond to the design of a photomask producing a wafer pattern with little distortions and artifacts compared to the target pattern, wherein the wafer pattern results from a photolithography process using the photomask. The extent to which the set of contours defined by a mask function $\psi(x, y)$ is optimal is calculated using a functional known as the "merit function", also referred to herein as the "Hamiltonian" H. The Hamiltonian H of a mask function $\psi(x, y)$ is indicative of the degree of similarity between the printed wafer pattern and the desired target pattern, the printed wafer pattern resulting from a photolithography process using a photomask given by the contours defined by $\psi(x, y)$. (We call the "merit function" the "Hamiltonian" by way of analogy to the Hamiltonian function used in classical dynamics or quantum mechanics).

Mathematically, the Hamiltonian H is a functional which maps a function to a real number:

$$H: C(\Re^2) \to \Re$$

Optionally, the Hamiltonian also depends upon a number of real parameters, or, as described below, is a functional of multiple mask functions. The Hamiltonian is chosen so that the optimal solution has the smallest value, i.e. we seek to find a mask function which minimizes the Hamiltonian. It follows that, once an appropriate Hamiltonian is specified, the problem of finding an optimally designed photomask is equivalent to the problem of finding a mask function which minimizes the Hamiltonian. It also follows that the specification of an appropriate Hamiltonian is a valuable step in applying the principles of our invention, given that the form of the Hamiltonian functional will directly determine the contours which result from the optimization problem.

Note that our description of the problem in terms of minimizing a Hamiltonian function is for purposes of description and not by way of limitation. Equivalent alternatives are available to one of ordinary skill in the art based on the presented description. For example, the problem can be formulated as a maximization problem rather than a minimization problem. Alternatively, one could choose a different mask function representation, for example, by assigning negative values to the function values at points on the inside of enclosed regions and assigning positive values to the points on the outside of enclosed regions. Alternatively, one could use the value $\psi(x, y)=0$ to describe chrome regions $\psi(x, y)=1$ to describe glass regions, and intermediate values could be used to describe the fraction of a given pixel area which is covered by glass. Yet another alternative would be to choose a level-set other than the zero level-set to specify contours, or to have the function value that represents the location of the contours vary across the photomask, possibly according to another function that defines the values which indicates the location of contours.

Figure 9:
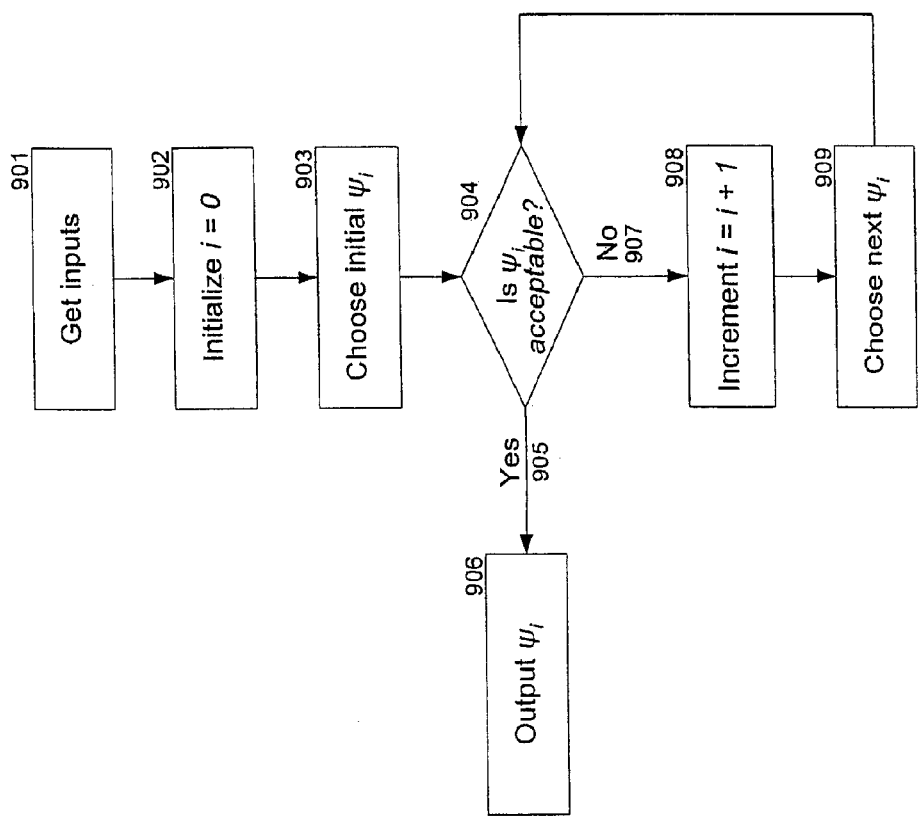
FIG. 9 is a flow chart illustrating a method for time-evolving contours of a photomask pattern in order to minimize a Hamiltonian function, according to an embodiment of the present invention.

FIG. 9 is a flow chart illustrating a method for time-evolving contours of a photomask pattern in order to minimize a given Hamiltonian function, according to an embodiment of the present invention. FIG. 9 depicts the steps used to find a function which defines an optimal photomask for a given target pattern. The function is found by iteratively refining an initial guess so that the refinements progressively result in better "merit" values, i.e. decrease a Hamiltonian H, wherein H depends on the target pattern, the particular photolithography process under consideration, constraints on the photomask manufacturing, and other factors to be described in detail below. We briefly describe the steps in FIG. 9 prior to providing the detail.

Start 901 with a set of initial inputs, which may include a target pattern, parameters describing the particular photolithography process under consideration, mask manufacturing restrictions, and other factors to be described in detail below. Initialize 902 i=0 and choose 903 an initial mask function $\psi_i(x, y)=\psi_0(x, y)$. Determine 904 whether $\psi_i(x, y)$ is acceptable (details on determining this below). If $\psi_i(x, y)$ is 905 determined to be acceptable, output 906 $\psi_i(x, y)$ as the result of the minimization, and finish. Otherwise 907, increment 908 i by one and choose 909 a next $\psi_i(x, y)$ so as to gain an improvement (details on choosing next $\psi_i$ appear below), repeating until $\psi_i(x, y)$ is determined 907 to have acceptable "merit", and finishing by outputting 906 the final $\psi_i(x, y)$ as the result of the minimization. Because the initial mask function $\psi_0$ changes through each iteration, it can be thought of as evolving with time, and it is convenient to think of each successive function $\psi_i(x, y)$ as a discrete snapshot of a continuously evolving "time-dependent mask function" $\psi(x, y, t)$ of space and time (t denoting time).

Figure 10A:
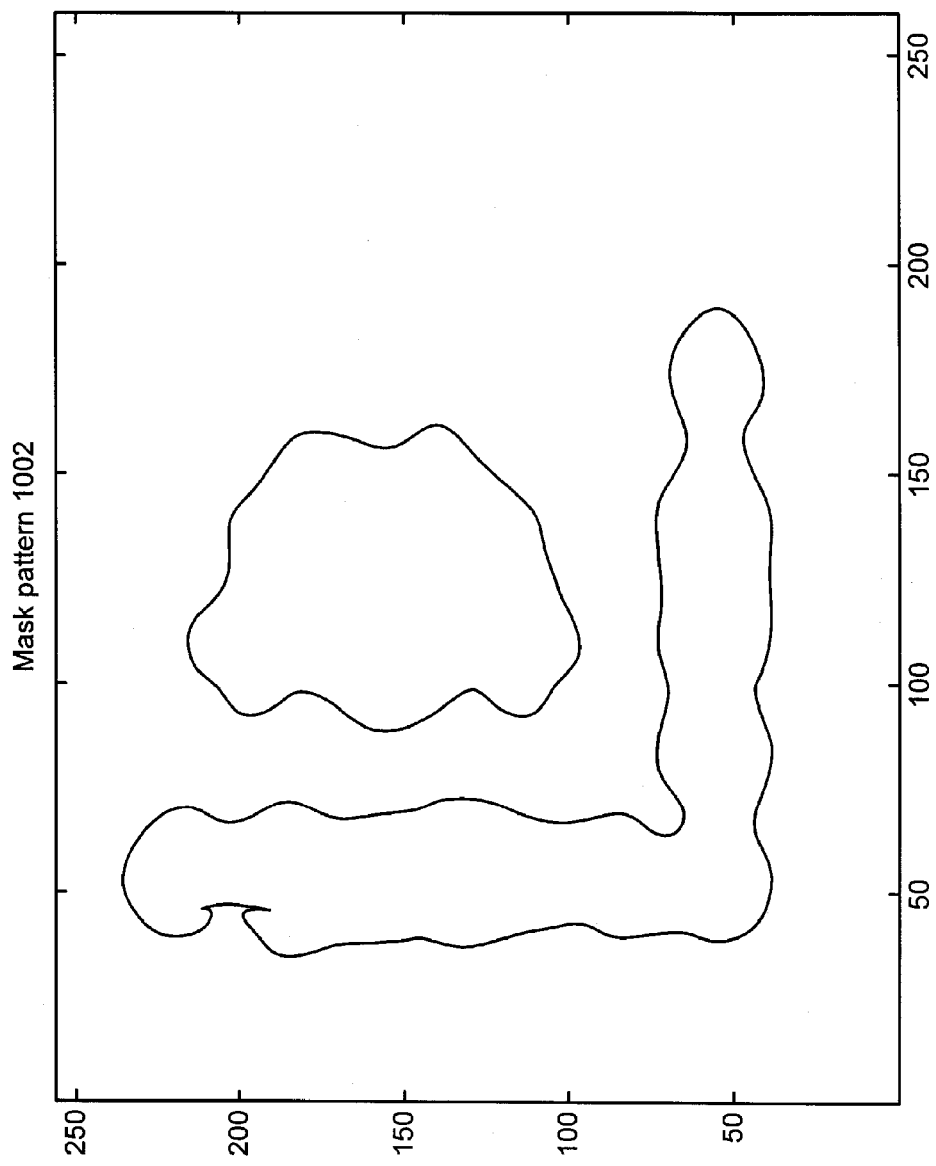
FIG. 10a is a diagram illustrating a photomask pattern, according to an embodiment of the present invention.
Figure 10B:
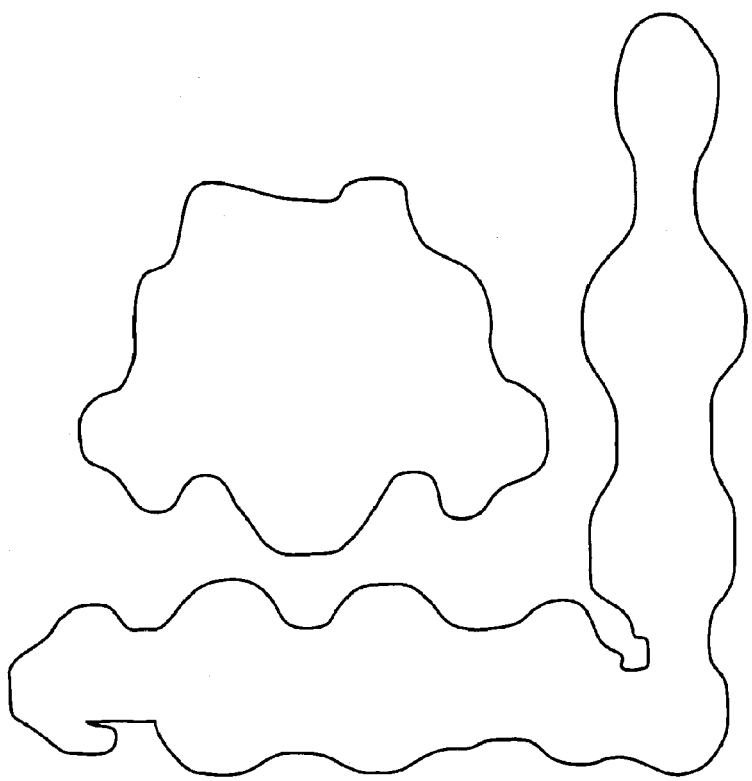
FIG. 10b is a diagram illustrating a photomask pattern corresponding to a final function output by the algorithm, according to an embodiment of the present invention.
Figure 10C:
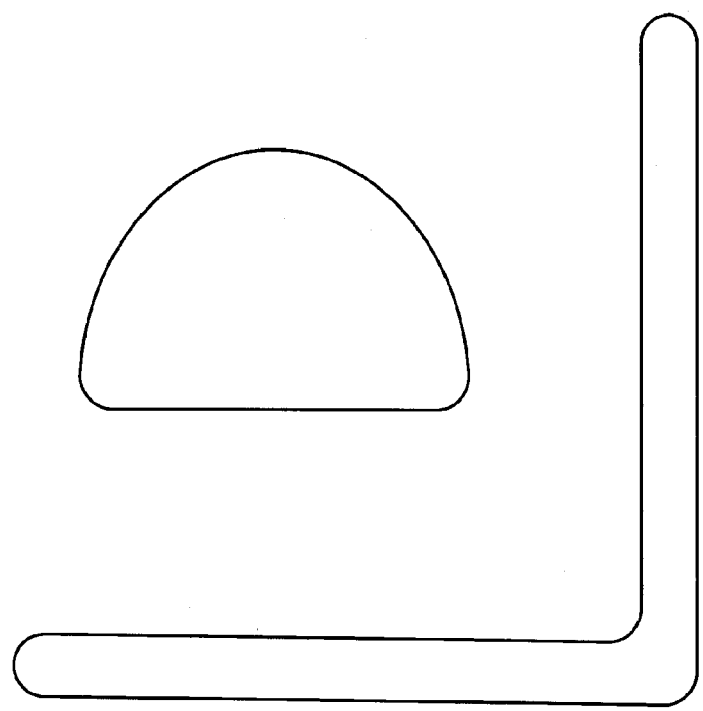
FIG. 10c is a diagram illustrating a wafer pattern as produced using the photomask pattern of FIG. 10b in a photolithography process.

FIG. 10a illustrates a photomask pattern 1002 corresponding to a mask function $\psi_i(x, y)$ after about 500 iterations of the algorithm. FIG. 10b illustrates a photomask pattern 1003 corresponding to a final mask function output by above optimization algorithm. FIG. 10c illustrates a wafer pattern 1004 as produced using photomask pattern 1003 of FIG. 10b in a photolithography process.

Figure 10D:
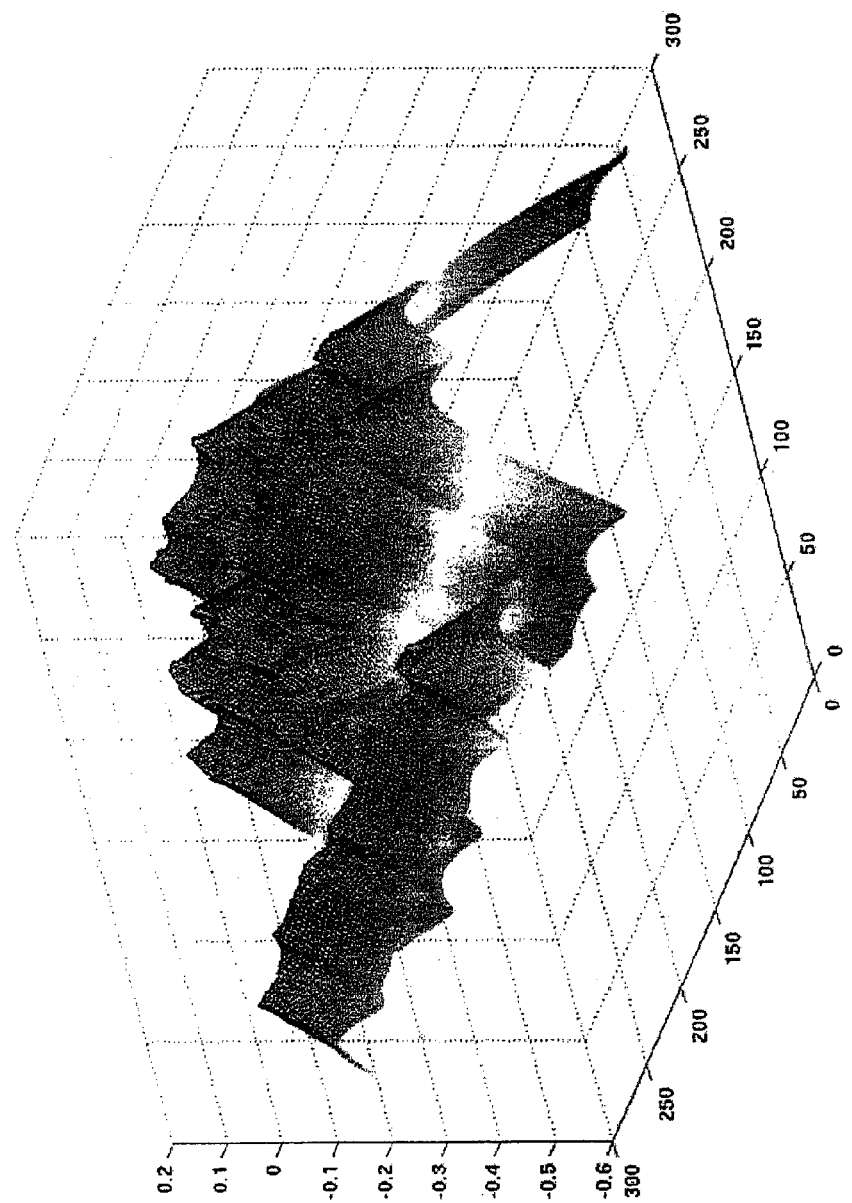
FIG. 10d is a diagram illustrating a final function output by the algorithm, based on the initial function shown in FIG. 8b corresponding to the initial photomask shown in FIG. 6, according to an embodiment of the present invention.
Figure 10E:
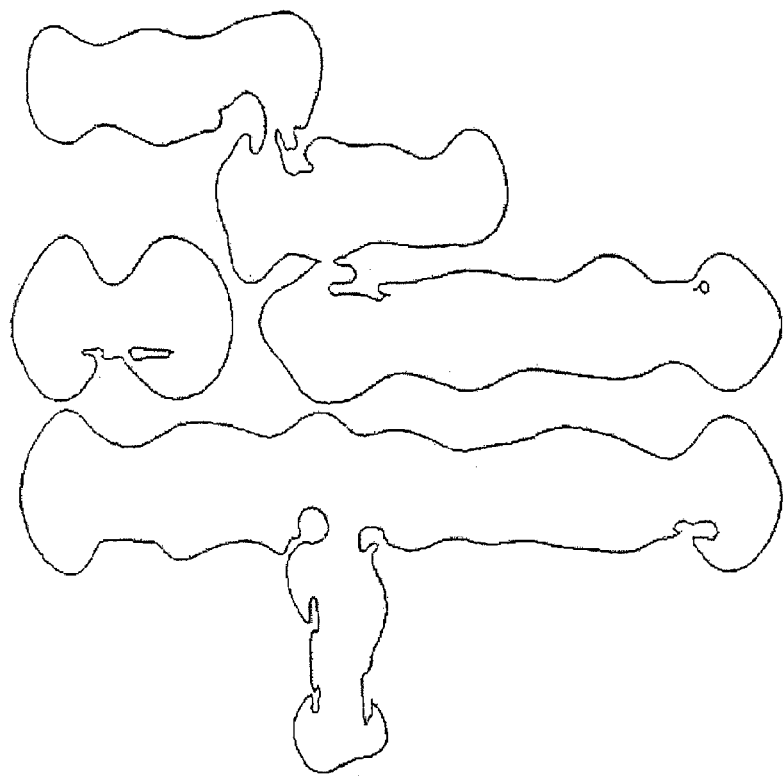
FIG. 10e is a diagram illustrating a photomask pattern corresponding to the function of FIG. 10d, according to an embodiment of the present invention.
Figure 10E:
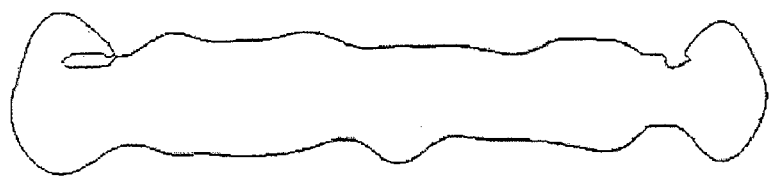
Figure 10F:
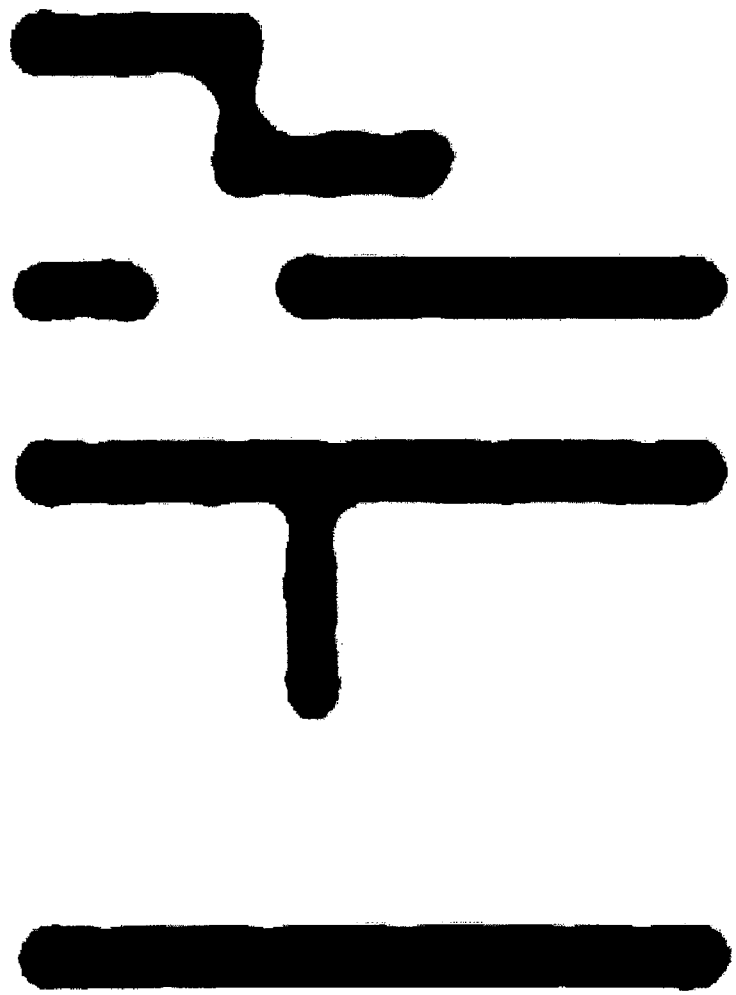
FIG. 10f is a diagram illustrating a wafer pattern as produced using the photomask pattern of FIG. 10e in a photolithography process, according to an embodiment of the present invention.

FIG. 10d illustrates a final mask function $\psi_i(x, y)$ 1005 output by above optimization algorithm, based on the initial function 801 shown in FIG. 8b corresponding to the initial photomask 600 shown in FIG. 6. FIG. 10e illustrates a photomask pattern 1006 corresponding to function 1005 of FIG. 10d. FIG. 10f illustrates a wafer pattern 1007 as produced using photomask pattern 1006 of FIG. 10e in a photolithography process.

In one embodiment, a succeeding function $\psi_{i+1}(x, y)$ is chosen by adding a small change $\Delta_i(x, y)$ to the current mask function $\psi_i(x, y)$, wherein $\Delta_i(x, y)$ is another function over the same domain as $\psi_i(x, y)$:

$$\psi_{i+1}(x,y)=\psi_i(x,y)+\Delta_i(x,y) \quad (1)$$

Figure 10H:
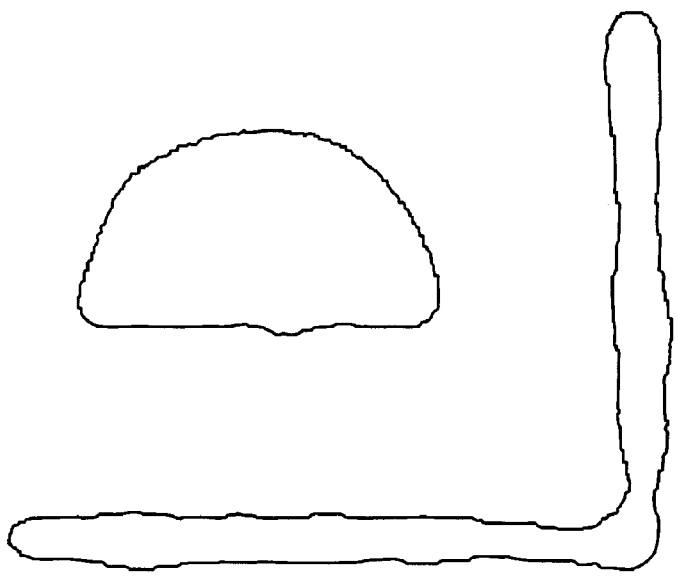
FIG. 10h is a diagram illustrating a wafer pattern as produced using the rectilinear photomask pattern of FIG. 10g in a photolithography process, according to an embodiment of the present invention.

In an embodiment, a succeeding function $\psi_{i+1}(x, y)$ is chosen by first adding a small change $\Delta_i(x, y)$ to the current function $\psi_i(x, y)$ and then projecting the resulting sum onto a sub-space which constrains the contours to be rectilinear (details on the projection appear below). FIG. 10g illustrates a rectilinear photomask pattern 1008 output by above algorithm based on the initial photomask 400 shown in FIG. 4. FIG. 10h illustrates a wafer pattern 1009 as produced using rectilinear photomask pattern 1008 of FIG. 10g in a photolithography process.

In one embodiment of our invention, we calculate $\Delta_i(x, y)$ as follows:

$$\Delta_i(x, y) = \Delta t \cdot \left\{ \frac{\delta H}{\delta \psi} \bigg|_{\psi=\psi_i} + R(\psi_i) \right\} \cdot |\nabla \psi_i| \quad (2)$$

where $\Delta t$ is a small constant hereinafter referred to as "time-step", $\delta H/\delta \psi$ is the Frechet derivative of the Hamiltonian H, $R(\psi)$ is a "regularization term" which slightly modifies the evolution of the mask function to improve numerical stability, and $|\nabla \psi_i|$ is the norm of the gradient of the function $\psi_i(x, y)$. Each of these terms as well as the projection operation will be described in more detail below.

In still another embodiment of our invention, we use the continuous-time version of equation (2) above and time-evolve the time-dependent level-set function according to the equation $$\frac{\partial}{\partial t}\psi(x, y, t) = \left\{ \frac{\delta H}{\delta \psi} + R(\psi) \right\} \cdot |\nabla \psi| \quad (3)$$

which can be implemented computationally using a variety of techniques different from the discretization described in equation (2) above, but that are known to one of ordinary skill in the art.

Figure 11:
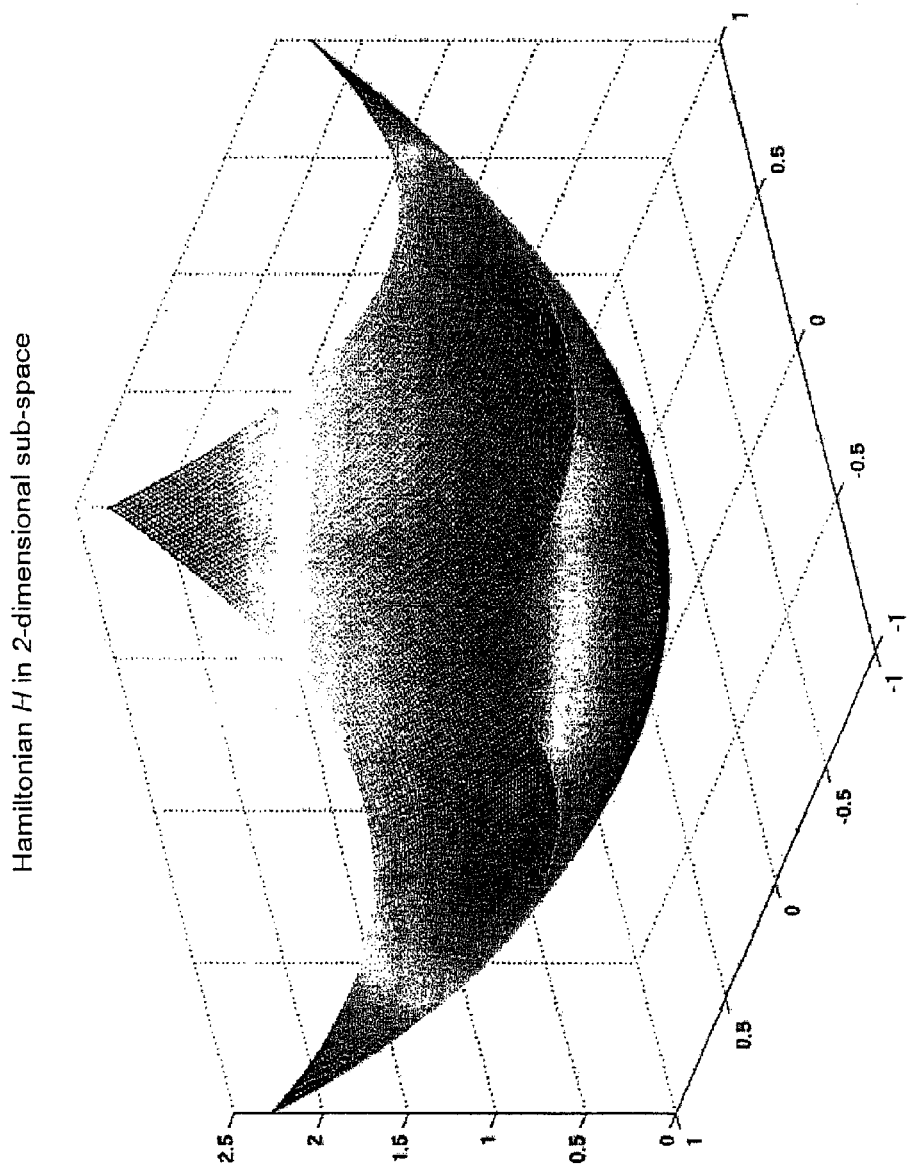
FIG. 11 is a diagram illustrating a 2-dimensional sub-space of an m-dimensional solution space of functions, showing Hamiltonian H as a function of $\psi(x_1, y_1)$ and, according to an embodiment of the present invention.

In an embodiment, and to facilitate computation, a mask function $\psi_i(x, y)$ is represented by a discrete set of m function values over a set of m points in the (x, y) plane. In one embodiment, the set of m points comprises a grid spanning an area representing the photomask, in which case they may be thought of as pixels. Alternatively, the set of m points is chosen according to a different arrangement in the area representing the photomask. From this perspective, a mask function $\psi_i(x, y)$ and a "small change" function $\Delta_i(x, y)$ are determined by their values at the set of m points and consequently can be considered as m dimensional vectors in "solution space." FIG. 11 is an illustration of the possible values for the first two components of an m-dimensional vector representing a mask function, i.e., illustrating a 2-dimensional subspace of solution space. In the subspace shown, we plot H as a function of $\psi(x_1, y_1)$ and $\psi(x_2, y_2)$. For this example, both $\psi(x_1, y_1)$ and $\psi(x_2, y_2)$ can vary between $-1$ and $+1$. The minimum in this example is seen to occur at $\psi(x_1, y_1)=0.3$ and $\psi(x_2, y_2)=-0.2$. Starting with an initial guess at a function $\psi_0(x, y)$, we approach the minimum by taking a small step (in step 509) in the direction of "steepest descent" to obtain a new location which is closer to a minimum. By repeating this process we quickly reach a minimum. Time-evolving the function according to above preferred embodiment is analogous to the foregoing, except that the dimensionality of the entire "solution space" is much greater than 2 (for example, it can equal the number of grid points m in the discretized version, or be infinite in a continuous version).

From the above discussion, it is seen that one can find the minimum without actually calculating the Hamiltonian. However, it may be useful to calculate the Hamiltonian in order to determine the "merit" of the current mask function. For example, it may be reasonable to stop iterating, even before the algorithm converges on an optimal solution, if a sufficient solution has been found. Similarly, one may wish to check the Hamiltonian occasionally (every several iterations), or only at those times when an adequate solution seems likely to have been found, such as when the mask function evolution generates only small changes in the succeeding mask functions.

At this point we shall reexamine the steps of the flow chart of FIG. 9 in more detail:

Input

The algorithm starts 901 with a set of inputs, among them a target pattern given in a particular format ("pattern I/O formats"). The target pattern may be presented in a variety of formats, including, but not limited to:
1. Image formats, such as bitmaps, JPEGs (Joint Photographic Experts Group), or other image formats;
2. Semiconductor industry formats, such as GIF, GDSII, Oasis, OpenAccess; or
3. Proprietary formats, such as an Electronic Design Automation (EDA) layout database.

The target pattern itself may be a representation of various types of content, for example (but not limited to):
1. One or more levels of an IC design for a particular IC type;
2. A pattern for a non-IC application (e.g. a MEMS device, or disk drive head, or optical component);
3. A pattern which can be used as part of a larger design, such as a standard cell, or DRAM bit cell, etc.

The algorithm also accepts one or more constraints as input, including (but not limited to) target pattern or mask pattern constraints, which may be specified as rules (such as critical dimensions, tolerances, etc.); and target pattern or mask pattern constraints specified as additional images (in a "pattern I/O format") specifying for example maximal or minimal areas to be covered, or critical regions, etc.

It is contemplated that the teachings of the present invention can be used to refine a photomask pattern determined through some other process, and that the output of the algorithm of present invention could be fed, or otherwise used, as input into another technique or methodology for optimally providing a photomask. In general, an iterative process is contemplated in which a mask pattern is taken through a series of transformations, with the teachings of the present invention accomplishing a subset of those transformations.

The teachings of the present invention can also be employed using a variety of possible input patterns for a variety of possible purposes, including (for example, but not limited to) memory applications (such as DRAM, SRAM, PROM, EPROM, Flash, EEPROM, etc.), microperipheral applications (such as systems support, communication, GPUs, mass storage, voice, etc.), microprocessor applications, digital signal processor ("DSP") applications, digital bipolar logic applications (general purpose, programmable logic, application specific integrated circuits ("ASICs"), display drivers, bipolar memory, etc.), analog applications, or other non-IC related applications (like MEMS, optical devices, etc.).

Other accepted inputs include parameters of the Hamiltonian function, including but not limited to parameters of the physical model used to simulate the photolithographic process, and parameters indicating the desired attributes of the eventual solution. These may include, for example, the number and type of photomasks employed, the wavelength of a stepper machine, the type and properties of the illumination, the type and properties of the photoresist, the type and properties of the lens, etc. Other parameters may include properties of error sources, such as defocus, exposure, alignment, defects, etc.

In example embodiments, the present invention is applied to a variety of purposes, for example:
1. Various IC applications (DRAM, SRAM, microprocessors, etc.);
2. Various IC technologies (CMOS, MOSFET, copper, GaAs, etc.);
3. Various lithographic processes (double mask, CMP, resist types, damascene, etc.);
4. Various wavelengths (248 nm, 193 nm, etc.); or
5. Various masking technologies (chrome on glass, PSM, CPL, Att-PSM, etc.) resulting from various mask writing technologies (ebeam, laser, raster-scan, shaped-beam, etc.).

Initialization

After receiving inputs in step 901 and initializing 902 $i=0$, we initialize 903 the function $\psi_0$. In theory, almost any initial function should be sufficient; however, initial conditions can have an impact on the time required for convergence and therefore on the cost of the process. Moreover, it is possible that for sufficiently poor initial conditions the algorithm will fail to converge.

A variety of ways to initialize the mask function will be apparent to one of ordinary skill in the art. In one embodiment of the present invention, the initial function is chosen, according to an initial photomask pattern comprising enclosed regions (to be chosen below), by assigning
1. the value $+1$ to $\psi_0(x, y)$ everywhere within the enclosed regions of the photomask pattern;
2. the value $-1$ to $\psi_0(x, y)$ everywhere outside the enclosed regions of the photomask pattern; and
3. the value 0 to $\psi_0(x, y)$ at the boundaries (contours) of the regions of the photomask pattern.

However, it is desirable to have a smoother and approximately continuous function as the mask function. In an embodiment of the present invention, the mask function is a "distance function," wherein the value of the function at a given point represents the (signed) distance of the point to the (nearest) boundary of a region in photomask pattern (positive inside a region's boundary, negative outside). Such a distance function has a variety of useful properties. For example, in the context of the present invention, a distance function allows for computations that depend not just on what is inside a region's boundary or outside a region's boundary, but what is "near" the boundary, where "near" is functionally based on distance. As the function evolves, it slowly loses its property as a distance function. However, this can be corrected using a "re-distancing" process, known to one of ordinary skill in the art.

It remains to determine an initial photomask pattern on which to base the choice of the initial function $\psi_0(x, y)$ in step 903. A variety of possible choices are available including (but not limited to) the following:

1. Random. This is unlikely to be the choice leading to fastest minimization, but it should be very robust;
2. The target pattern. Especially for the case of a single chrome and glass mask, choosing the initial mask pattern to be equal to the target pattern is likely to perform fairly well. This is because it is possible for the final mask pattern to be similar to the target pattern;
3. The result of heuristics applied to the target pattern. For example, an OPC algorithm is applied to the target pattern, with the result used as the initial mask pattern. For multiple mask processes, one approach is to use heuristics to split the pattern into multiple exposures, for example, separating horizontal and vertical lines;
4. Results from previous solutions to the same or similar problems. These are likely to be similar to the desired final pattern; or
5. Results from solutions to other similar regions on the mask. As above, these are likely to yield similar solutions. One can imagine, for example, that the mask comprises individual mask areas. As pattern on such individual areas are optimized, the solutions can be used as initial guesses for other areas. Since the optimal solution for a given area will depend upon interactions with neighboring areas, the solutions may not be the same. However, the optimal solution from one area may serve as a good initial guess for another similar area.

In another embodiment, we exploit the fact that repeated patterns exist in an IC circuit design, some of which patterns may themselves be composed of repeating patterns and so on in a hierarchy, to first optimize a photomask segment or region on the bottom of the hierarchy (that is, the smallest pieces often referred to as "standard cells"). Combinations of these solutions can then be used as the initial guesses for solutions (in step 903) to larger pieces, and combinations of these larger solutions can then be used as the initial guesses for even larger pieces, etc. Applying the teachings of the present invention in a hierarchy process may in some cases allow for very fast convergence, especially when local criteria are used to determine convergence.

There are numerous ways to initialize an original target photomask pattern. The previous possibilities that have been described are meant only as a partial list of possible alternatives.

In one embodiment, a mask function is stored as an array of values representing the value of the function at fixed points on a 2-dimensional grid. Optionally, a more sophisticated approach (referred to as "local level-set") only stores the values near the boundaries; depending upon the pattern and the resolution, this can be significantly more efficient. Other ways of representing and storing a mask function will be apparent to one of ordinary skill in the art.

Checking the "Merit"

As seen in the flow chart, in step 904 the algorithm determines if it has converged upon a suitable set of contours so as to provide an optimal photomask. In one embodiment, this check is performed after each step in the evolution of the contours. Alternatively, this check is performed after two or more steps of the evolution.

One simple method to determine whether an acceptable solution has been found (in step 504) is to calculate the value of the Hamiltonian $H(\psi_i)$ resulting in a "merit" of the current solution. Alternatively, a solution is deemed acceptable based on the number of iterations performed. It may be advantageous to use locally defined criteria to stop iterating in areas of the photomask where the solution is already acceptable, and to continue iterating in areas where the solution has not yet reached an acceptable level of merit. In this context, "local" can mean on the level of a pixel, on the level of a small area (for example, an interaction distance), on the level of a hierarchical subdivision of the mask area, or on other alternative levels.

Yet another indication of convergence is provided by the magnitude of the gradient (in "solution space") or Frechet derivative—as the contours approach an optimal state, the derivative decreases and approaches zero. Similarly, the change in the shape of the contours from one iteration to another iteration provides an indicator of convergence. Although we have described several indicators, one of ordinary skill in the art will recognize other indicators as well.

Time-Evolving Contours

As described above, in an embodiment a mask function evolves in a series of steps in which we add to it a small function $\Delta_n(x, y)$ calculated via equation (2)

$$\Delta_i(x, y) = \Delta t \cdot \left\{ \frac{\delta H}{\delta \psi} \bigg|_{\psi = \psi_i} + R(\psi_i) \right\} \cdot |\nabla \psi_i|$$

It is common for the optimization problem of example embodiments to be mathematically "ill-posed" in the sense that the solution may be non-unique. In order to avoid inherent numerical instabilities during the time evolution we employ a "regularization" technique, adding a small term $R(\psi)$ to the Hamiltonian $H$ in order to help stabilize the time evolution. The resulting contours will have less "noise" and appear smoother to the eye. There are many ways to add regularization which will be apparent to those skilled in the art, including (but not limited to):

$$R(\psi) = \nabla \cdot \frac{\nabla \psi}{|\nabla \psi|}. \qquad 1$$

Mean curvature regularization—Adding this term tends to reduce noise in the image by minimizing the length of contours.

$$R(\psi) = \nabla \cdot \frac{\nabla \psi}{|\nabla \psi|} - \overline{\nabla \cdot \frac{\nabla \psi}{|\nabla \psi|}} \text{ (with the bar indicating average).} \qquad 2$$

Average mean curvature—This tends to minimize the length of the boundaries while keeping the total area of the enclosed regions fixed, giving preference to smoother contours and contours enclosing larger regions, since larger regions have less boundary per unit area as compared to many small regions.

$$R(\psi) = \frac{\partial}{\partial x}\left(\frac{\psi_x}{|\psi_x|}\right) + \frac{\partial}{\partial y}\left(\frac{\psi_y}{|\psi_y|}\right). \quad 3$$

Wulf-crystal regularization or Wulf curvature. This is similar to curvature except that it prefers Manhattan geometries. Other variations of Wulf regularization can be used preferring straight edges in Manhattan geometries or 45 degree angles. Use of Wulf-crystal regularization may be helpful in the design of masks with rectilinear contours, although it will not guarantee rectilinear geometries.

$$R(\psi) = \frac{\partial}{\partial x}\left(\frac{\psi_x}{|\psi_x|}\right) + \frac{\partial}{\partial y}\left(\frac{\psi_y}{|\psi_y|}\right) - \overline{\frac{\partial}{\partial x}\left(\frac{\psi_x}{|\psi_x|}\right) + \frac{\partial}{\partial y}\left(\frac{\psi_y}{|\psi_y|}\right)}. \quad 4$$

Average Wulf curvature—Combining aspects of average mean curvature and Wulf Curvature, this exhibits a preference for rectilinear contours enclosing large regions.

In all of the above regularization expressions, it is possible for the denominator in one or more of the fractions to equal zero. In order to avoid dividing by zero, one can add a small constant to the denominator, or set the expression equal to zero whenever both the numerator and denominator equal zero.

One of ordinary skill in the art will recognize other possibilities for regularization. It should be obvious that it may be desirable for the amount or type of regularization to change with time as the contours evolve, and that alternative ways of introducing regularization are apparent to those skilled in the art and are part of the teachings of the present invention.

It is an advantageous aspect of example embodiments of the present invention that further desirable properties of the resulting contours can be incorporated into the merit function. For example, it may be desirable for a photomask to have a smaller number of larger features rather than a larger number of smaller features. This may not improve the quality of the resulting printed photomask pattern, but it may be easier or more cost effective to fabricate the photomask corresponding to the simpler contours and hence offer commercial utility as an advantage in doing so. One can address this by adding additional terms to the Hamiltonian so as to increase the "merit" of solutions of this nature (for example, so that contours lacking fine details are preferred over contours with many fine details). Equivalently, adding such terms to the Hamiltonian can also be thought of as adding "regularization". In this way, regularization is used not only to improve numerical stability, but also to yield desired attributes in the resulting contours. It is a matter of personal preference and interpretation as to what aspects of the Hamiltonian are considered "regularization" terms and which aspects are considered to be part of the optimization problem.

In equation (2), as well as in several of the regularization expressions, we need to compute $|\nabla \psi|$. The way in which the gradient is computed can have important consequences in terms of numerical stability. In example embodiments, techniques for calculating gradients known to those skilled in the art as Hamilton-Jacobi Essentially Non-Oscillatory (ENO) schemes or Hamilton-Jacobi Weighted Essentially Non-Oscillatory (WENO) schemes may be used. Alternatively, other ways of computing the gradient are used, as are known to one of ordinary skill in the art.

In a similar vein, the time evolution of the time-dependent mask function can be implemented using a variety of numerical techniques. One embodiment described above uses what is known as "first order Runge Kutta". Alternatively, other variations such as third order Runge Kutta can be used as will be obvious to those skilled in the art.

The method of gradient descent involves multiple iterations; the size of the function $\Delta_t(x, y)$ chosen as part of performing step 509 is scaled by the "time-step" $\Delta t$ appearing in equation (2). The larger the time-step, the faster the system converges, as long as the time-step is not so large so as to step over the minimum or lead to numerical instabilities. The convergence speed of the algorithm can be improved by choosing an appropriate time-step.

There are numerous ways to choose the time-step $\Delta t$. In one embodiment, we choose a time step that is just small enough so as to guarantee that the system is stable. In an alternative embodiment, we start with a large time step and gradually reduce the time step as the algorithm approaches a minimum. In an alternative embodiment, we vary the time step locally and per sub-area of the photomask. Other approaches will be known to those skilled in the art, or other means of adapting the time step to the specific situation.

In another embodiment, one can use what are known as implicit methods, optionally with linear-preconditioning, in order to allow for a larger time-step. Still other variations will be known to one of ordinary skill in the art.

Analogous to refining the time granularity by reducing the time-step, in one embodiment of the present invention the granularity or placement of the grid of points on the photomask is adjusted in a time-dependent fashion as the algorithm approaches convergence. By performing the initial iterations on a larger grid, and increasing the number of grid points with time as greater accuracy is desired, a solution is obtained more quickly. Other such "multi-grid" techniques will be apparent to those skilled in the art. Another possibility is using an adaptive mesh technique, whereby the grid size varies locally.

It is possible that the process of time-evolving the contours arrives at a configuration from which there is no "downhill" path in "solution-space" to a solution, or in which such paths are inordinately long or circuitous. In such a state, convergence may require a large number of iterations. Also, the algorithm may get "stuck" at a local (but not global) minimum. Some example techniques for handling such a situation are as follows:

1. Changing the Hamiltonian. Various modifications can be made to the Hamiltonian in order to bridge local minima in solution space; for example, regularization terms can sometimes be used for this purpose;
2. Addition of random bubbles. Adding random noise to a mask function will create new regions, which can then time-evolve into the solution. Noise (that is distortion) can be purposefully added at random or it can be targeted in specific regions (for example, known problematic target geometries, or regions which are not converging on their own to acceptable errors, etc.);
3. Heuristic bubbles. Rather than adding random noise, a specific modification feature, known from experience to generally help the system converge, is added; for example, if certain areas appear to be evolving too slowly, one could add a constant to the level-set function in that area, thereby making all the features in that area "bigger";

4. Uphill steps. By making uphill moves, either at random, or specifically in places, the algorithm avoids getting stuck in local minima and works toward a global minimum. Similar techniques from discrete optimization or simulated annealing which are useful to the algorithm of the present invention will be apparent to one of ordinary skill in the art.

Alternatives to the previous example techniques will be apparent to those of ordinary skill in the art.

Projection Operator

In many cases, it is desired to constrain the solution to rectilinear contours, for example to improve manufacturability or reduce costs of the corresponding masks. The present invention enforces this constraint by using a projection operator.

The projection operator can be understood by considering the solution-space of all possible contours, and recognizing that the set of rectilinear contours is a sub-space of the solution-space. The projection operator constrains the evolution of the contours to within the sub-space of rectilinear contours.

The projection operator takes a set of possibly curvilinear contours and approximates them with a set of rectilinear contours. In one embodiment, choose a fixed grid size (possibly corresponding to manufacturing capabilities), and "round" every contour to the nearest grid. This is accomplished, for example, by setting the level-set function to be positive if the majority of the points within a single grid-cell are positive, negative if the majority of the points within a single grid-cell are negative, and zero along the boundaries. An alternative embodiment of the projection operator would involve scanning the m function in the horizontal and vertical directions, looking for stretches with approximately constant value. Such stretches can be reset to the average value along the length of the stretch, thereby straightening the contour. Alternative implementations of the projection operator will be apparent to one of ordinary skill in the art.

In one embodiment of the present invention, the projection operator is applied to the mask function after each time-step iteration. In this way, the contours are always constrained to be rectilinear. In an alternative embodiment, the contours are allowed to evolve for multiple time-steps between applications of the projection operator, in which case the contours may temporarily deviate from strict rectilinear form. The frequency of projection may depend upon factors such as speed of computation, choice (or implementation) of the projection operator, or the manner (or implementation) of the curvilinear time-evolution.

In an alternative embodiment of the present invention, a projection operator can be applied to the increment function $\Delta_t(x, y)$, so that a rectilinear mask remains rectilinear. In yet another embodiment, the projection operator applied to the increment function $\Delta_t(x, y)$ can take into account the current mask function, in order to keep the number of rectilinear segments fixed.

The projection operator can also be used to take into account other constraints which are desirable for manufacturability of the photomask. For example, in some cases it may be desirable for the segments that compose a rectilinear photomask to line-up across the photomask, so that if the mask is written with a shaped-e-beam, the total number of shots is kept to a minimum ("Fracture friendly"). In one embodiment of the invention, the projection operator would determine a set of rectilinear contours to minimize the number of shots. This can be accomplished using the scanning method described above by considering two sides of a feature at the same time, and starting and ending segments on both sides of the feature such that they are in alignment. In other embodiments of the invention, the projection operator could correct for minimum spacing or sizing constraints.

Other embodiments of the invention may incorporate one or more of the goals of rectilinear masks, fracture friendliness, minimum spacing, and minimum sizing, by incorporating these factors into the merit function.

Merit Function/Hamiltonian

As illustrated, the optimization problem and the resulting contours are determined by a merit function referred to as the Hamiltonian. There are many alternative ways to choose a merit function within the scope of the present invention. In one embodiment, the Hamiltonian comprises a sum of two parts:

1. A first part, based upon mask contours themselves; and
2. A second part, based upon the resulting pattern which would be printed on a wafer or die given the photomask corresponding to the mask contours.

The first part of the Hamiltonian may comprise one or more terms such that the resulting optimized photomask pattern has properties which are desirable from a manufacturing point of view; for example, the "regularization" terms described above can be viewed as elements of the Hamiltonian that exhibit a preference for contours corresponding to more easily manufacturable masks.

The second part of the Hamiltonian takes into consideration a model of the photolithographic process, i.e. a method for calculating the wafer pattern resulting from a particular mask pattern (a "forward model"). Following describes an example forward model for one embodiment of the present invention.

In a typical photolithographic process, light passes through the photomask and the lens, and then falls upon the wafer, where the photoresist is exposed. For coherent illumination, the electric field falling upon the photomask is approximately constant. The clear regions of the mask pass the light, while the opaque regions block the light. It follows that the electric field, just behind the mask, can be written as:

$$M(\vec{r}) = \begin{Bmatrix} 0 & \text{chrome} \\ 1 & \text{glass} \end{Bmatrix}$$

where $\vec{r} = (x, y)$ is a point on the (x,y) plane. Corresponding to an embodiment of the present invention wherein the regions in which the level-set function is positive indicate glass and the regions in which the level-set function is negative indicate chrome (with the level-set equal to zero at the boundaries or contours), one can write the previous expression as a function of a level-set function $\psi(x, y)$ as follows:

$$M(\vec{r}) = \hat{h}(\psi(x,y))$$

wherein $\hat{h}$ is the Heaviside function:

$$\hat{h}(x) = \begin{Bmatrix} 1 & x \geq 0 \\ 0 & x < 0 \end{Bmatrix}$$

Because an ideal diffraction limited lens acts as a low-pass filter, this will serve as a good approximation to the actual (almost but not quite perfect) lens used in a typical photolithographic process. Mathematically, the action of the lens would then be written as follows:

$$A(\vec{r}) = f^{-1}(\hat{C}(f(M(\vec{r}))))$$

where $A(\vec{r})$ indicates the electric field distribution on the wafer, $f$ indicates a Fourier transform, $f^{-1}$ indicates an inverse Fourier transform, and $\hat{C}$ indicates the pupil cutoff function, which is zero for frequencies larger than a threshold determined by the numerical aperture of the lens, and one otherwise:

$$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases}$$

wherein $k_x$, $k_y$ and $k_{max}$ represent frequency coordinates in Fourier space.

Finally, we determine the image in the photoresist upon the wafer. In one embodiment this process is modeled using a "threshold resist": in regions where the intensity is greater than a given threshold (which we shall call $I_{th}$), the resist is considered exposed; in regions below the threshold, the resist is considered unexposed. Mathematically, this is handled once again with a Heaviside function:

$$I(\vec{r}) = \hbar(|A(\vec{r})|^2 - I_{th})$$

Combining the above, we find that:

$$F(\psi(x,y)) = \hbar(|f^{-1}(\hat{C}(f(\hbar(\psi(x,y)))))|^2 - I_{th})$$

This is a self-contained formula which reveals the wafer pattern corresponding to the photomask pattern defined by the level-set function, within the context of the model just described. It should be emphasized that this is just one particular possible forward model that can be used within the scope of our invention, chosen by way of example due to its relative simplicity. More sophisticated forward models also fall within the scope of the present invention. Such models would take into account, by way of example but not limitation, multiple exposures, various illumination conditions (e.g., off-axis, incoherent), the actual electromagnetics of the light field interacting with the photomask, various types of photomasks besides chrome on glass (e.g., attenuated phase shifting, strong phase shifting, other materials, etc.), the polarization of the light field, the actual properties of the lens (such as aberrations), and a more sophisticated model of the resist (e.g., diffusion within the resist), such as a variable threshold model, lumped parameter model, or a fully three dimensional first principles model. Models may also take into account the vector nature of the electromagnetics field as it propagates through the system, including into the resist stack., or even Maxwell's equations as it applies to various parts of the lithographic process, including the photomask or the resist stack. Forward models may include the use of parameters which are determined by calibrating the model to a set of calibration patterns which have been previously printed on a wafer and measured. In some embodiments, the forward model may take into account the effects of immersion lithography.

Because the inverse algorithm requires many iterations of the forward algorithm, the latter may be implemented efficiently in example embodiments. However, as a general rule, more sophisticated models are likely to run slower than simpler models. One embodiment of the present invention compensates for this difference in model speed by beginning with a simpler model and then gradually introducing more sophisticated models as the process converges, thereby postponing the full complexity until the last iterations. In an alternative embodiment, a more accurate model is used during some iterations, and then a simpler model is used to calculate the difference from the previous step. In an alternative embodiment, switching between different models at different time steps obtains an averaging effect. For example, this represents an efficient way to explore the space of error-parameters. Other variations will be apparent to one of ordinary skill in the art.

In one embodiment, the Hamiltonian compares the pattern resulting from the forward model with the target pattern in order to determine the figure of merit. For example, an $L_2$-norm may be calculated:

$$H(\psi(x,y)) = |F(\psi(x,y)) - T(x,y)|^2$$

wherein $T(x, y)$ indicates the target pattern. The $L_2$-norm is indicative of the area of the non-overlapping regions of the two patterns. This metric approaches zero as the two patterns converge. Other examples of determining a figure of merit are as follows:

1. Other Norms. These might include a cubic or other polynomial functions of the differences;
2. Level-set differences. By representing a resulting pattern as a level-set function one can calculate the distance between the boundaries, integrated over the length of the boundaries;
3. Local variations. Different parts of the image may have different degrees of importance when it comes to variations from the target pattern. For example, gates generally need to be much more accurately printed than interconnects. In one embodiment, a weighting function assigns more weight to non-overlapping areas in the portions of the design having higher accuracy requirements. A related approach gives priority to a measure of distances between curve, or to other metrics; or
4. Semantics. Certain types of errors are considered more significant than other types. For example, within small tolerances, variations from the target pattern are irrelevant, whereas variations outside some tolerances are fatal, taking into account the intent of the design and not just the geometry of the design, In one embodiment, use local weightings to account for errors. As an example, consider a gate which must be printed within specific tolerances. Then the weighting factor becomes large for points outside the tolerances. Within tolerances, the weighting factor would be smaller, and optionally still nonzero (so that the algorithm still prefers designs that are closer to the target). Other ways of incorporating design semantics into the merit function will be apparent to one of ordinary skill in the art.

One desirable property of the Hamiltonian function is a preference for contours representing masks which are robust against errors in the mask fabrication or in the photolithography process. Such robustness is known as "process latitude." Errors which are likely to be most important and therefore likely to be considered include exposure and defocus. However, other aspects of process latitude, such as mask defects, alignment errors, lens aberrations, etc., are candidates for consideration. Process latitude can be incorporated into the merit function in a variety of ways. In one embodiment, the Hamiltonian comprises a sum of terms, each term representing the quality of the image printed under a set of error conditions. In an alternative embodiment, the Hamiltonian is indicative of the probability that the pattern prints within specified tolerances. Other ways of incorporating process latitude into the merit function will be apparent to one of ordinary skill in the art. In example embodiments, the merit function allows the flexibility to determine what types of errors are important and how important they are. For example, one mask may print perfectly when in perfect focus, but degrade rapidly when out of focus, while another mask may print less accurately in focus, but be more robust against defocus errors. Therefore, in example embodiments, the merit function allows for flexibility in preferring one mark over another.

Once again, it should be emphasized that the Hamiltonian can taken into account any desirable property of the photomask and any model of the photolithography process. Optionally, an adjustment is provided to the Hamiltonian according to empirical measurements of an actual fabrication process. The foregoing Hamiltonian and variations described above are by way of example only, not by way of limitation. Similarly, the photolithography process described above is by way of example only; the teachings of the present invention can be applied to any photolithographic process that can be modeled with a Hamiltonian function.

Output

The flow chart shown in FIG. 9 ends with an output of the resulting contours, representing a mask suitable for one of the potential photolithography applications and conforming to the specifications and constraints specified in a suitable "pattern I/O format."

Other outputs in addition to the photomask pattern corresponding to the optimized contours are contemplated. In one embodiment, the final value of the Hamiltonian function is output to indicate the merit of the solution, optionally to be interpreted as a probability estimate that the resulting process will print within specification. Examples of other outputs include various process latitude parameters (e.g. range of defocus), properties of the photomask itself (e.g. manufacturing cost estimate, phase assignments, number of features, etc.), or other outputs apparent to one of ordinary skill in the art.

Generalizations

Foregoing discussion frequently considers a single mask function representing contours on a single mask, the interior of those contours corresponding to chrome regions, and the exterior corresponding to glass regions. However, in many cases it will be desirable to find contours separating multiple types of regions on the same mask, for example, chrome, glass, and phase-shifted glass, and/or either alternatively or simultaneously to find contours corresponding to boundaries of regions on multiple masks, to be used in a multiple exposure process. Both generalization fall within the teachings of our invention.

To allow for multiple masks it suffices to simultaneously optimize multiple mask functions, an algorithm for which follows directly from above discussions: each mask function time-evolves according to an equation analogous to (2), except that the terms on the right hand side now depend upon multiple mask functions, instead of just on one.

One can easily allow for multiple types of regions in a similar manner to the way in which one handles multiple masks, i.e., with multiple mask functions. However, with multiple-types of regions on the same mask, one must prevent regions from overlapping. Consider an example where glass regions correspond to those areas in which the first function is positive, phase-shifted regions correspond to those areas in which the second function is positive, and chrome regions correspond to those areas in which both functions are negative. Prohibiting the possibility for the same region to be both clear glass and phase-shifted glass, add a constraint which prevents both functions from being positive in the same area, for example by adding a "penalty" term to the Hamiltonian, the penalty term taking on a very large value whenever the two functions overlap. Thus, as the system time-evolves, the contours move so as to remain non-overlapping. It should be apparent that this concept can be extended in a trivial manner to more than two level sets and more than three types of regions. Alternatively, one can allow both functions to evolve freely, and assign precedence to one of them, e.g., if both are positive, define the region as clear glass. Other means of representing multiple regions (also called "multi-phase flow" in the literature) will be apparent to those skilled in the art, and fall within the scope of our invention.

Similarly, while the foregoing discussion refers typically to a mask consisting of only chrome and glass regions, these types of regions should not be construed to limit the applicability of the present invention, which is useful for any number of different types of regions. By way of example (but not limitation), phase-shifted regions, regions covered with materials other than chrome (e.g., in an attenuated phase shifting mask), and half-tone regions would all be within the teachings of the present invention.

In still another embodiment, a function can be used to represent the pattern of the illumination optics; as in the foregoing discussion of multiple masks, this function can be optimized simultaneously with those representing one or more photomasks. In yet another embodiment, various parameters of the Hamiltonian can be optimized simultaneously with one or more mask functions, in an analogous manner.

Sub-Grid Resolution

In an example embodiment, the mask function may have the following useful property: when such a function is stored in a computer using a pixelized representation, that is, as a matrix of values sampled from a grid in the (x,y) plane, the pixelized representation can specify the precise location of the contours at a resolution substantially smaller than the pixel size. For example, if the pixels are stored in a computer using 32-bit floating point values, rather than the pixel size. This is an example only and the value of a mask function may be specified with other resolutions as well, such as 64 bit values, 8 bit values or other values which can be different that the resolution provided by the pixels.

When the mask function is represented by a discrete set of values, most commonly (but not necessarily) arranged in a grid of pixels, it is often the case that the contour defining the boundaries between the regions of the photomask pattern does not fall exactly on a pixel boundary. For example, if the mask function is chosen as a level-set function with the zero level-set defining the boundary, than the value $\psi 0(x, y)=0$ may not occur for any discrete x,y sampled by a particular pixel. In such a representation, one possibly beneficial approach is to initialize the pixel values such that they indicate the position of the boundary with sub-pixel resolution. For example, if the mask function is a distance function, then the value of the pixels near the contour can be set to the signed distance to the contour corresponding to the initial pattern.

Similarly, when the final mask function is determined, it is often desired to output the result in a pattern I/O format which is different from the internal representation of the mask function. It is accordingly an aspect of the present invention that the output pattern, when described in a pattern I/O format, may have a precision or resolution that is finer than the pixel density or grid size, if such an internal representation is used, or the distance between sample points in a more complex representation. Frequently, converting an output mask from a mask function representation into a pattern I/O format with sub-pixel resolution can be accomplished by exploiting the fact that the mask function representation will often make use of several bits per pixel, and these bits specify the accurate position of the contour within the pixel, thereby allowing one to specify the pattern contour in the pattern I/O format with sub-pixel resolution.

It is also possible to represent the target pattern on a pixel based grid with a precision or resolution that is finer than the pixel density or grid size, in a manner similar to the above. This may be useful in computing the merit function in an efficient manner.

The above approach can also be applied when using multi-resolution or multi-grid techniques, or in an adaptive mesh approach, or in a local level set approach, or virtually any other approach that represents a continuous mask function with a discrete set of values, even if the mask function is not represented by a simple pixel map. Accordingly, alternative embodiments (such as alternative mask functions and means of interpreting and representing mask functions) would also fall under the present invention.

A pattern I/O format may be used to read in the target, output the final photomask, or input or output other patterns and images of masks, wafers, targets, heuristic information about the photomask (such as markings of gate regions or other special regions), an initial guess that might be used an initial photomask in the iterative process, or other 2-d pattern information. In one embodiment of the invention, the pattern I/O format used may be based on what we call a vector or polygon type description, by which we mean that the description of the pattern contains the start and end points of various lines, or the vertices of polygons, or other means of describing the shapes of the pattern that are not inherently pixel-based. GDSII and Oasis would be examples of such polygon-type descriptions. It is an aspect of an example embodiment of the invention that such patterns upon input or output may be converted from polygon-type representations into area or pixel based representations, or converted from area or pixel based representations into polygon-type representations. Such representations might include a representation based on binary pixels, or possibly a mask function representation as described previously, which might include, for example, a distance function representation. Such conversions between formats may take place at a resolution finer than the pixel size or grid size of the area based representation, if it uses pixels or values sampled on a grid.

Parallel System

It is often the case that a photomask will be quite large, in the sense of having a large number of contours. Alternatively, in a pixelized representation, such a photomask would consist of a large number of pixels. Computing the optimal design for an entire photomask at one time on a single CPU may be computationally demanding. In such situations, it may be beneficial to divide the pattern into separate regions, and process each region on a separate compute node in a cluster of machines.

There are several ways in which such parallelization can be accomplished. In one approach, the plane is partitioned into non-overlapping regions, with each region to be solved on a particular compute node, and each individual node communicates information about the region it is processing and its boundary conditions to those nodes that are processing neighboring regions. An advantage of this method is that a large number of processors can be used simultaneously to solve for the optimal mask function over a large area, in such a manner that the solution obtained would be exactly the same as in the case in which all of the work was accomplished on a single node.

Figure 12:
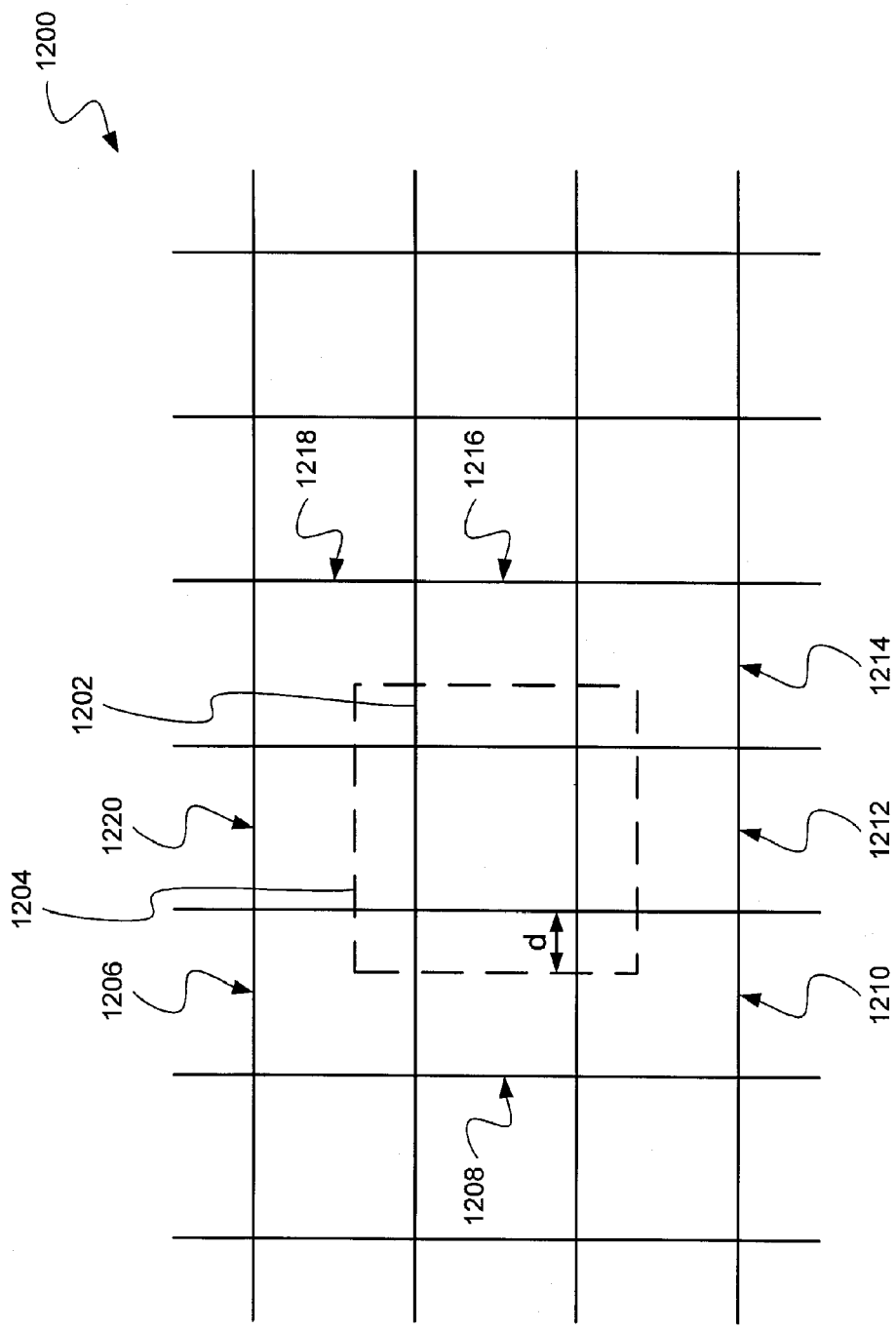
FIG. 12 is a diagram illustrating a halo around a block of a photomask pattern according to an embodiment of the present invention.

In an alternative approach, the plane is divided into separate non-overlapping regions, but when such regions are processed on individual compute nodes, the machines compute the optimal mask for each region along with a halo region of a fixed thickness surrounding the given region. Because the impact of one area of a photomask on another area of the same mask diminishes with distance, the mask function found in this approach will be almost the same as if the entire mask was processed on a single compute node, as long as the halo thickness is sufficiently large. FIG. 12 illustrates a portion of a photomask pattern divided into an array of blocks 1200, including block 1202. The block 1202 will have a target pattern specified for a portion of the integrated circuit or other workpiece. The size of the blocks may depend upon the features of the design, including the size of repetitive structure, boundaries that provide processing efficiency, or other criteria. In some embodiments, a fixed block size may also be specified. For instance, in an example embodiment, the blocks in FIG. 12 may range from 1 micron by 1 micron to 10 microns by 10 microns, or any range subsumed therein. These are examples only and other block sizes may be used. As shown by the dashed line at 1204, a halo may be defined around block 1202. This halo overlaps with adjacent blocks 1206, 1208, 1210, 1212, 1214, 1216 and 1220. The halo extends beyond the block 1204 by a distance d in each direction. The distance may be selected based on process parameters and the level of expected interference from adjacent regions and computational complexity (since the halo increases the size of each region that is be processed). While the size of the halo may vary, in some embodiments, it may range from 0.5 microns to 2 microns or any rang subsumed therein or from 5% to 10% of the width or height of the block or any range subsumed therein. These are examples only and other halo sizes may be used.

An advantage of this method is that each region along with its halo can be processed completely independently of all other regions. In yet another approach, the entire photomask is divided into regions with halos as above, but the computer analyzes such regions in order to find repetition. If a particular region of the target pattern, halo included, is identical to a similar area in another portion of the target pattern, then this region need only be processed once, since both instances will yield identical results. Since it often occurs that a single pattern repeats many times throughout a target design, using this approach to eliminate repetition can be advantageous. Other approaches to parallelizing the problem are also possible, depending on the computer architecture.

In one embodiment of the invention, the target design is provided as one of a set of inputs to a computer system. The design could be sent over a network or it could be provided on tape or on a variety of removable storage media. The computer system would begin by analyzing the design and breaking it into a large number of individual pieces. In one embodiment, the design is stored in a file system, and one or more servers that have access to the file system would perform this step. Alternatively, the file system may be local to one or more of the servers (such as a local hard drive). The cutting up of the design could be based upon a variety of criteria, as there are multiple ways of dividing a design into pieces. The pieces may be square, or rectangular, or any other shape. It is usually preferable for the pieces to be non-overlapping (not counting the halos, which if they are included, are overlapping by definition), but it is not necessary for the pieces to be non-over-lapping. In some embodiments, the design may be stored in an intermediate format, different from the original input format. In one embodiment, the design is "flattened" before processing, so that the breaking of the design into pieces does not need to consider hierarchy. In another embodiment, a partition is predetermined to guide the cutting processes, and as the input file is read, polygons are divided into files according to which partition they would fall under. Still other approaches for reading, analyzing, and breaking a design into pieces are possible within the scope of the invention.

Once the design has been broken into multiple pieces, each piece could then be sent to one or more servers designed to process the pieces and solve for the optimal photomask for each piece. The second set of servers may include the original set of servers, or may be a distinct machine or set of machines. The transmitting of the data could include sending the data over Ethernet, or Myrinet, or Infiniband, or any other method by which two or more computers can exchange information. Alternatively, the separate pieces can be written to a file system which one or more servers can access independently, as a means of transferring data from the original set of machines to the second set of machines. The data describing the individual pieces could be based on a pattern I/O format, or another polygon-type representation, or it could be a pixel or grid based representation, or an area based representation, such as a mask function or bit map. Optionally, additional information could be included, such as process information, for example, the wavelength or numerical aperture. In one embodiment of the invention, the individual pieces include halos so that they can be processed separately. In an alternative embodiment, some pieces may not include halos or may include halos on only some of the edges, and information is shared between pieces, as described previously, in order to address the boundaries for the edges which are not padded by halos. Such an implementation may be used, for example, on a shared memory multi-CPU machine, where information is easily and efficiently transferred between simultaneously running processes.

As it may be advantageous to minimize the amount of processing that needs to be completed, in some embodiments the system may optionally determine if there is repetition among pieces of the design to be processed. One way in which this can be accomplished is to calculate a signature for each piece, and then look for pieces with identical signatures. Another approach is to simply compare the pieces directly. In one embodiment, this repetition analysis is done during the first step, before the pieces are sent to be processed. Alternatively, in the second step, before a server begins to process a piece, it can look to see if an identical piece has been processed previously. Other approaches are also possible and fall within the scope of the invention. Because the decision as to how the pieces are cut will impact the amount of repetition, in some embodiments it may be desirable to consider possible repetition in the design during the cutting step. For example, if a design is based on cells, the pieces can be chosen to correspond to the individual cells, which are likely to appear in more than one place. Another possibility would be to choose rectangles which correspond to groups of such cells. Still another embodiment would arbitrarily cut the design into strips in one direction, but within each strip, choose rectangular pieces which are aligned with cell boundaries or other elements of the design, in such a way so as to maximize the possibility of finding repetition.

Once all the individual pieces are processed, the results are transferred to a third set of servers, which may be one or more servers and may or may not include one or more servers from the first and second set. Transferring of data can take place by a variety of means and in a variety of format, as above, when the pieces were originally sent to the second set of machines. Finally, the third set of machines assembles the pieces back together into a complete photomask design. In one embodiment, the individual pieces of optimized photomask are combined into a single GDSII file. In other embodiments, the output might be multiple files, and it is possible to have a separate file for each piece in some embodiments.

It is possible that one or more of the steps outlined above could be executed in parallel on one or more machines; for example, as the input design is processed, individual pieces could be sent to another machine which would compute the optimal mask and then forward the piece to a third machine which would begin assembling the pieces together. Such an approach could be considered a pipe-lined architecture. Similarly, parts of one or more of the steps could be completed on one or more servers while others are working on one or more of the other steps. In some embodiments, all of the steps would be performed on a single machine, or a single multi-processor machine (i.e., a single machine with multiple CPUs).

In the foregoing discussion, the servers described above could be any one of a number of different computing devices. One possibility would be standard blade servers; another possibility would be standard 1U rack mounted servers, or rack mount servers of various sizes, or another possibility would be a cluster of standard desktop machines or towers. In one embodiment, the processing would take place on a general purpose microprocessors, also called a GPU or CPU. For example, an Intel Pentium or AMD Opteron could be used. In other embodiments, the computing could be done on an FPGA, DSP, or ASIC. In one embodiment, some of the work would be done on a GPU and other parts of the work would be done another device. For example, the GPU could be used to process polygons, transfer data, read and write files, convert formats, and a variety of general tasks, and an FPGA could be used to perform the individual steps of the optimization. It is possible that an FPGA or ASIC could be specifically designed to perform operations on a mask function. One approach would be to use an FPGA, DSP, or ASIC to exploit the parallelization inherent in processing large arrays of pixel values used to represent a mask function. For example, a server could consist of a standard GPU along with a special accelerator board attached to the server which contains one or more FPGAs, DSPs, or ASICs, along with local on board memory. Pieces of designs could be passed to the GPU for processing, which would perform miscellaneous tasks as described above, and then transfer arrays to the board containing the special purpose processors, which would then perform computations on the mask function. The resulting optimal mask function could then be transferred back into the main memory of the mother board, allowing the GPU to perform any additional post processing and/or transfer the results back to another server or set of servers, for assembly as in the third step described above. It is also possible that the system could be designed such that the GPU has access to the memory of the accelerator board as well as its own memory, and in some embodiments the GPU might perform operations on the mask function interspersed with work performed by the FPGAs, DSPs, or ASICs.

Example System Architectures

Figure 13:
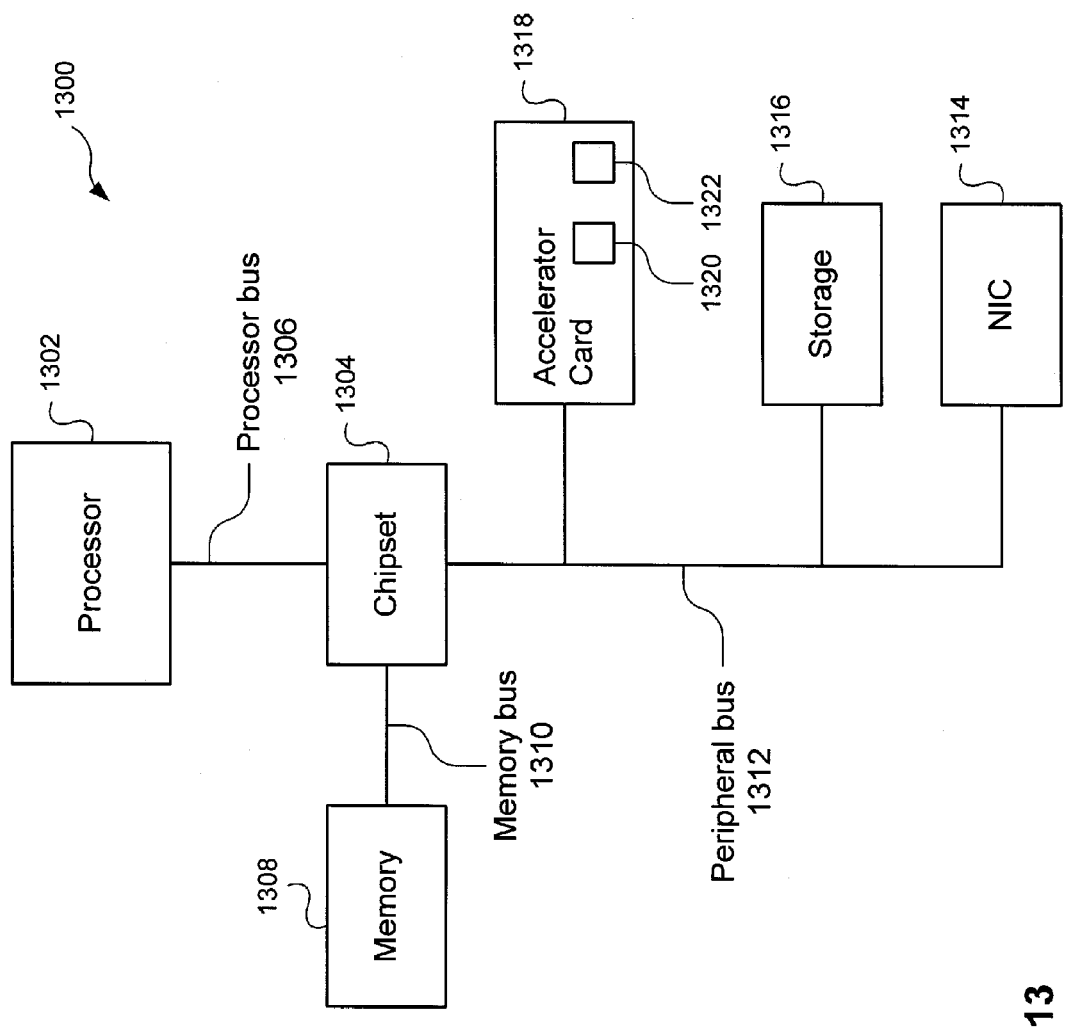
FIG. 13 is an example computer system according to an embodiment of the present invention.

FIG. 13 is a block diagram showing the architecture of an example computer system, generally indicated at 1300, according to an embodiment of the present invention. As shown in the example embodiment of FIG. 13, the computer system may include a processor 1302 for processing instructions, such as a Intel Pentium™ processor, AMD Opteron™ processor or other processor. The processor 1302 is connected to a chipset 1304 by a processor bus 1306. The chipset 1304 is connected to random access memory (RAM) 1308 by a memory bus 1310 and manages access to the RAM 1308 by the processor 1302. The chipset is also connected to a peripheral bus 1312. The peripheral bus may be, for example, PCI, PCI-X, PCI Express or other peripheral bus. In some embodiments, an accelerator card 1318 may be connected to the peripheral bus 1312. The accelerator card 1318 may include ASIC or other hardware for accelerating processing 1320. The accelerator card 1318 may also include on-board memory 1322. The computer system 1300 also includes one or more network interface cards (NICs) 1314 connected to the peripheral bus for providing network interfaces to a network. External storage 1316, such as a disk array or other non-volatile storage, is also connected to peripheral bus 1312.

Software instructions for implementing any of the methods described above may be stored in memory 1308, storage 1316, on board memory 1322 or other computer readable media and may be processed by the processor 1302 or accelerator card 1318. Representations of target patterns, photomask patterns or blocks or portions of the foregoing and other inputs and outputs may also be stored in memory 1308, storage 1316, on board memory 1322 or other computer readable media and may be processed by the processor 1302 or accelerator card 1318. These items may be stored in data structures or files or in other formats. In some embodiments, as described above, a functional representation of a photomask pattern or portion of a photomask pattern may be stored in an array, where the value of the function at grid points across the area of the pattern are stored in the array. In some embodiments, the processor may process a photomask pattern or portion of a photomask pattern in a polygon representation such as GDSII or Oasis and convert it to a functional representation using a grid or pixelized representation. It may then be provided to on board memory 1322 and processed by the accelerator card 1318. The accelerator card 1318 may include specialized hardware 1320 that efficiently processes the functional representation, merit function and change function and can be used for iteratively adapting the pattern as described above.

Figure 14:
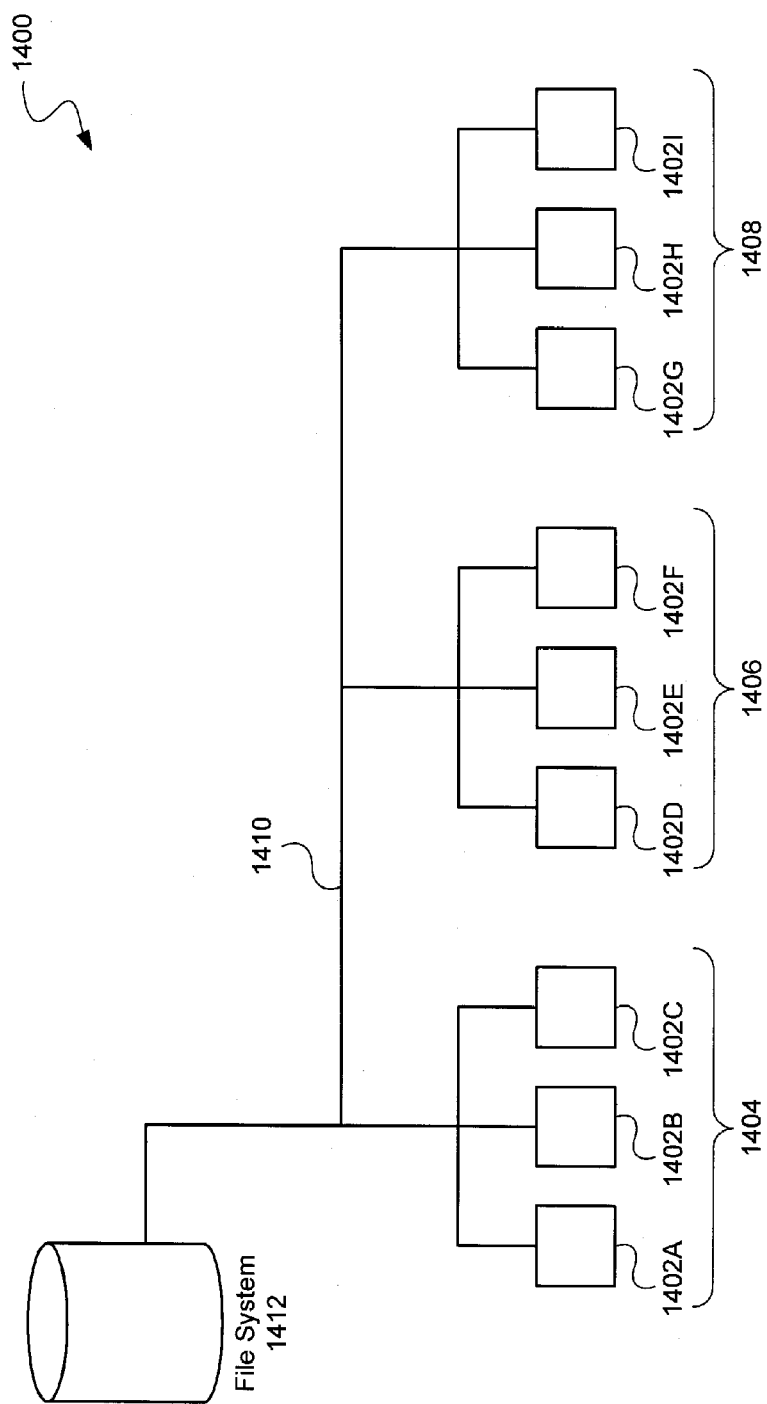
FIG. 14 is an example networked computer system according to an embodiment of the present invention.

FIG. 14 is a block diagram showing a networked computer system 1400, according to an embodiment of the present invention. In an example embodiment, each of the computers 1402*a-i* may have the architecture shown in FIG. 13 or other architecture and may be used for multi-processing to efficiently process a large integrated circuit design. The system may have a network file system 1412 (corresponding to external storage 1316 in FIG. 13) that is shared by the computers. It will be understood that other architectures may be used as well for multi-processing as described above, including a computer with multiple processors, a server with multiple blades or other architectures. One of the computers, or a group of computers 1404, may receive a target pattern for a layer of an integrated circuit device. This group of computers 1404 may convert the target pattern from hierarchical to flat format and divide the target pattern into blocks, which may include halos as described above in connection with FIG. 12.

In an example embodiment, the target pattern may be for a complex integrated circuit design with more than 10 million gates. In an example embodiment, the first group of computers may divide this pattern into 1 million or more blocks for processing. In an example embodiment, the design may include a minimum design feature size or pitch of 90 nm, 65 nm, 45 nm or less. The target pattern for the blocks generated by computers 1404 may be stored in files in file system 1412 or in data structures in memory and may be accessed by other sets of computers 1406 and 1408 over network 1410. The first set of computers 1404 may assign blocks to queues in file system 1412 to be processed by individual computers 1402*d, e* and *f*. In this way, the load can be balanced and a large complex design can be efficiently processed using multi-processing.

A second set of computers 1406 may access the blocks for processing. Each computer 1402*d, e* and *f* may be retrieve blocks from its queue and process them. The second set of computers may select functional or bit map representations for the patterns and iteratively adapt the patterns by evaluating merit functions. Change values may be added to adapt the pattern until a final output pattern is generated as described above. The final pattern for the block may be stored in file system 1412 and accessed by a third set of computers 1408.

The third set of computers 1408 may assemble the blocks to generate the entire mask pattern, or a portion thereof, and convert mask pattern into a polygon representation such as GDSII or Oasis or other format. The resulting mask pattern may be stored as a file in file system 1412.

Example Masks and Integrated Circuits

Photomasks may be manufactured using the mask pattern generated by the above systems and methods. Chrome, clear or phase shifted regions may be formed on a photomask in accordance with the mask pattern. For instance, FIGS. 15, 16, 17, 18B, C and D, 19B, C, D, E and F and 20B, C, D and E illustrate sample patterns that result from systems and methods according to example embodiments of the present invention. In these figures, the example patterns correspond to individual blocks of an overall photomask, although it will be understood that blocks may be combined into an overall pattern to be used in manufacturing a photomask.

Figure 15:
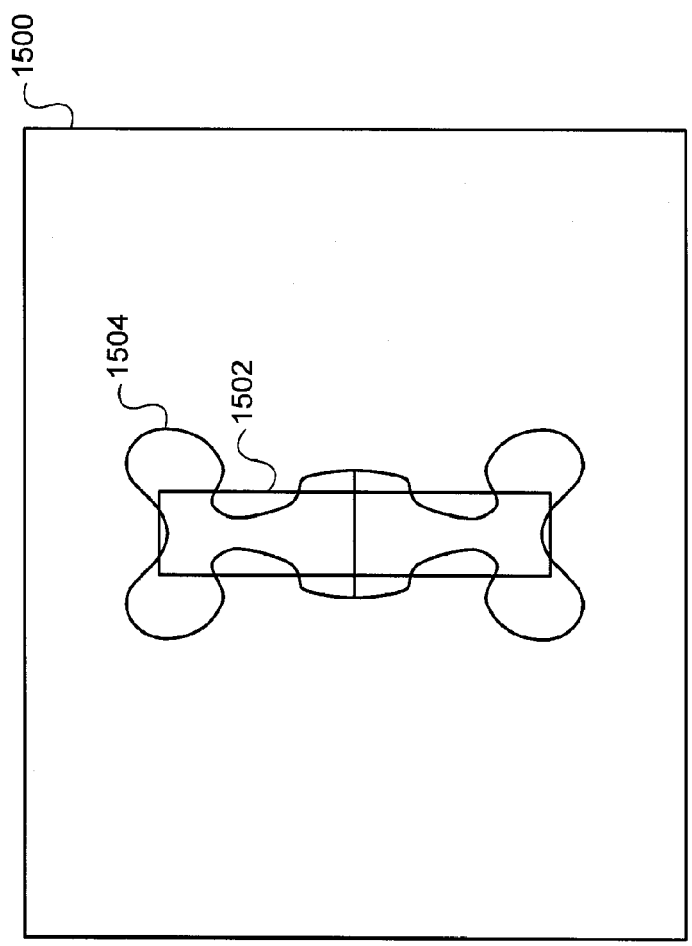
FIG. 15 is a diagram illustrating a wafer pattern and a photomask pattern for producing the wafer pattern, according to an embodiment of the present invention.

FIG. 15 shows an example pattern for block 1500. This block is about one micron square. This block has a target pattern 1502 that is an isolated rectangle of 100 nm×454 nm. The process parameters (provided as inputs) include an illumination wavelength of 193 nm, a numerical aperture of 0.85, a point source of illumination, an attenuated phase shift mask. The pattern is intended for a 65 nm generation, but is not limited to use with 65 nm design rules. The mask pattern 1504 is generated by the system and method according to an example embodiment. The mask pattern 1504 has two lobes protruding at each end of the rectangular target pattern (wider than the target pattern), a wide region (wider than the target pattern) in the middle and narrow regions (narrower than the target region) between the wide middle region and the lobes on each end.

Figure 16:
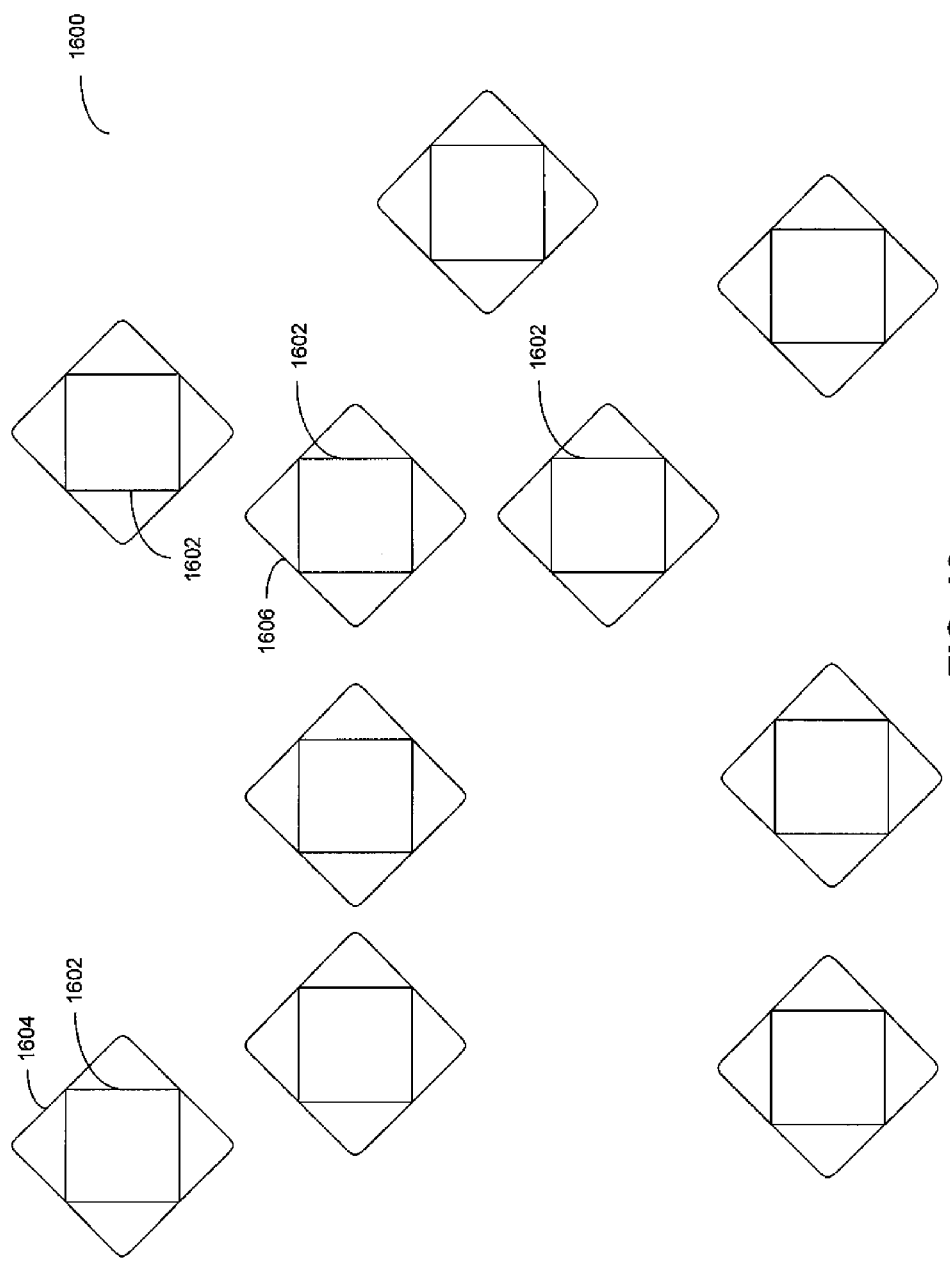
FIG. 16 is a diagram illustrating a wafer pattern and a photomask pattern for producing the wafer pattern, according to an embodiment of the present invention.

FIG. 16 shows an example pattern for block 1600. This block has a target pattern with various contacts 1602. The process parameters (provided as inputs) are an illumination wavelength of 193 nm, a numerical aperture of about 0.8, an annular source of illumination and an attenuated phase shift mask. FIG. 16 also shows grid points that may be used in processing the target pattern as described above. As shown in FIG. 16, a mask pattern with a diamond shape (with top/bottom points and side points wider than the target contact pattern) 1604 for isolated contacts may result. Contacts near one another may result in a mask pattern over the contact with an asymmetric shape 1606 that extends longer on one side than the other, in a tear drop shape.

Figure 17:
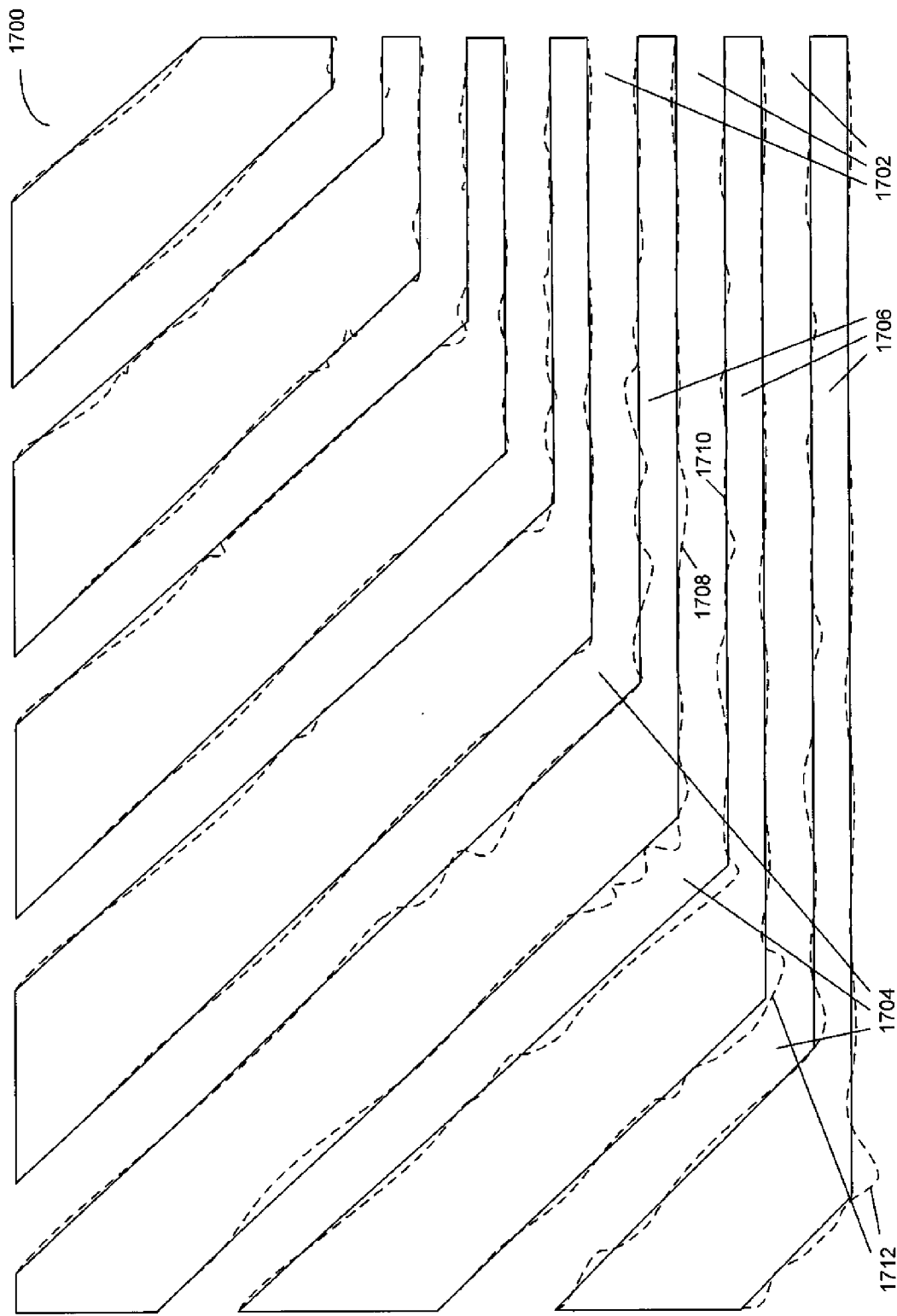
FIG. 17 is a diagram illustrating a wafer pattern and a photomask pattern for producing the wafer pattern, according to an embodiment of the present invention.

FIG. 17 shows an example pattern for block 1700. This block has a target pattern with parallel rectangular regions 1702 that turn at an angle as shown at 1704. The process parameters (provided as inputs) are an illumination wavelength of 193 nm, a numerical aperture of about 0.8, an annular source of illumination, an attenuated phase shift mask. The pattern is intended for a 65 nm generation, but is not limited to use with 65 nm design rules. The shaded regions 1706 show the mask pattern. As shown in FIG. 17, the mask pattern for each rectangular region alternatively curves inward (inside the target pattern) as shown at 1708 and then outward (outside the target pattern) as shown at 1710. The wave-like structures in this example have a characteristic periodicity which depends upon the effective wavelength of the light source. These regions are somewhat offset between parallel rectangular regions (when a region of a mask pattern protrudes outward over one target pattern, the mask pattern over the adjacent target pattern tends to curve inward). At the corner where the target pattern turns at an angle, there is a larger outward protrusion at the outer corner of each turn as shown at 1712. The pattern varies such that each bend is slightly different, according to the surrounding patterns and pitch (space between neighboring features).

Figure 18B:
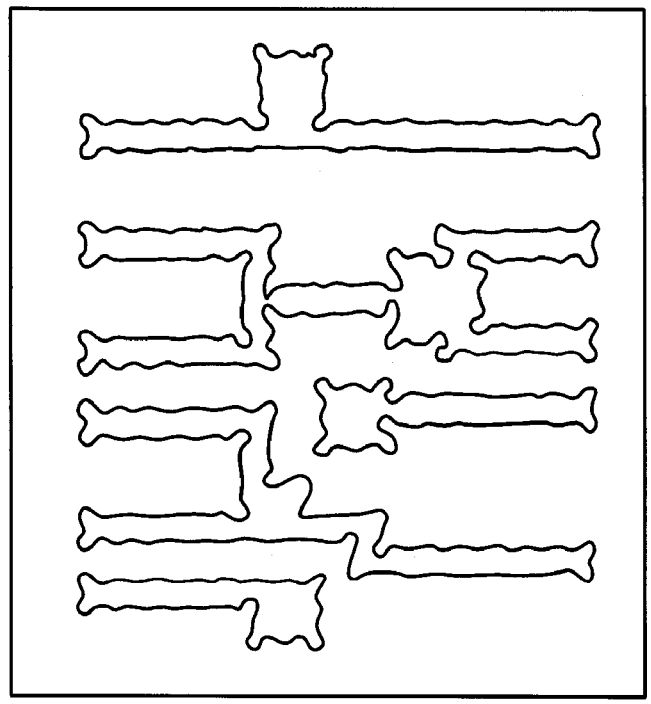
FIG. 18A is a diagram illustrating a wafer pattern and FIGS. 18B, C and D illustrate photomask patterns for producing the wafer pattern, according to an embodiment of the present invention.
Figure 18A:
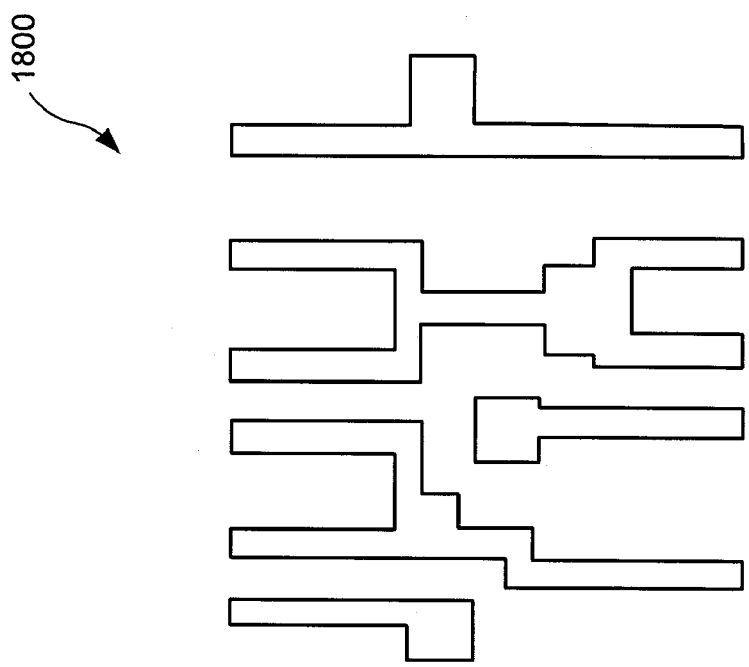
Figure 18D:
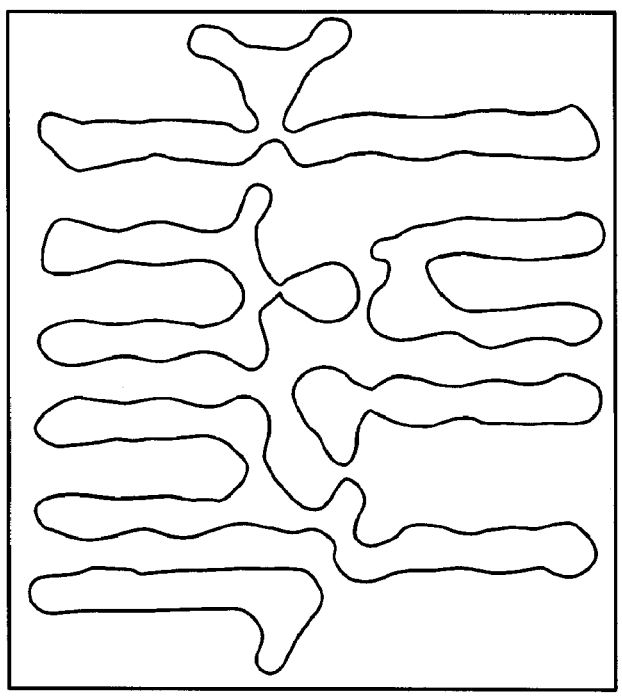
Figure 18C:
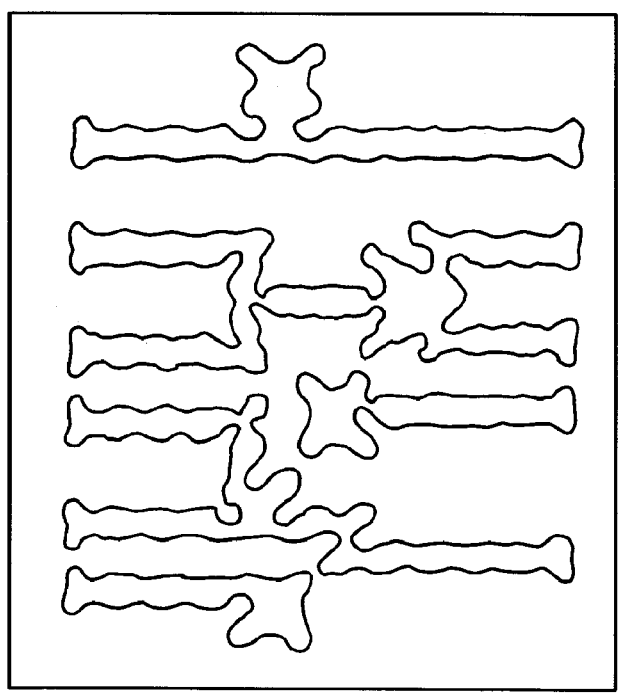

FIG. 18A shows an example target pattern 1800. FIGS. 18B, C and D show sample mask patterns for this target pattern using different process parameters. While the target pattern 1800 is shown as the same for each process, it will be understood that the target pattern may be scaled to a different size for each of the processes. FIG. 18B shows the mask pattern for a binary chrome and glass mask, 130 nm design rules, 193 nm illumination wavelength, numerical aperture of 0.7 and annular illumination. FIG. 18C shows the mask pattern for a binary chrome and glass mask, 85 nm design rules, 193 nm illumination wavelength, numerical aperture of 0.7 and annular illumination. FIG. 18D shows the mask pattern for a binary chrome and glass mask, 45 nm design rules, 193 nm illumination wavelength, numerical aperture of 0.7 and annular illumination.

Figure 19B:
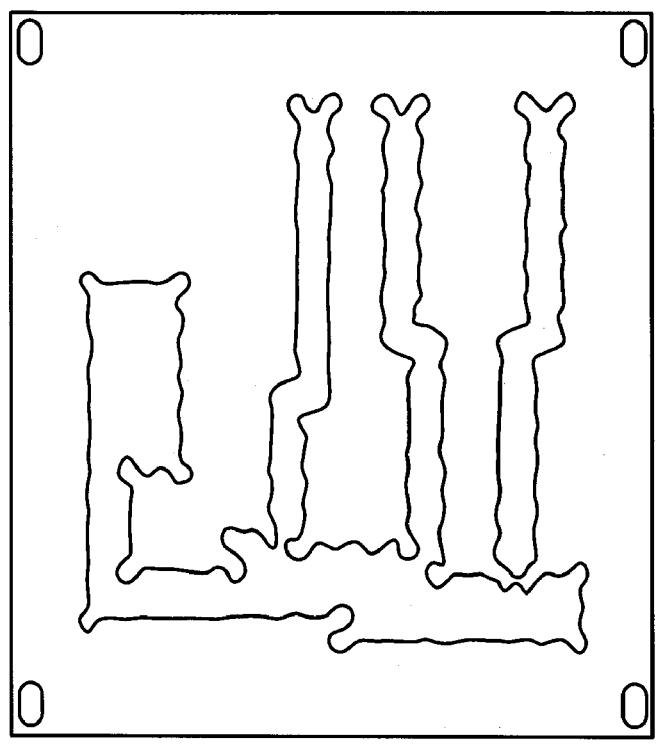
FIG. 19A is a diagram illustrating a wafer pattern and FIGS. 19B, C, D, E and F illustrate photomask patterns for producing the wafer pattern, according to an embodiment of the present invention.
Figure 19A:
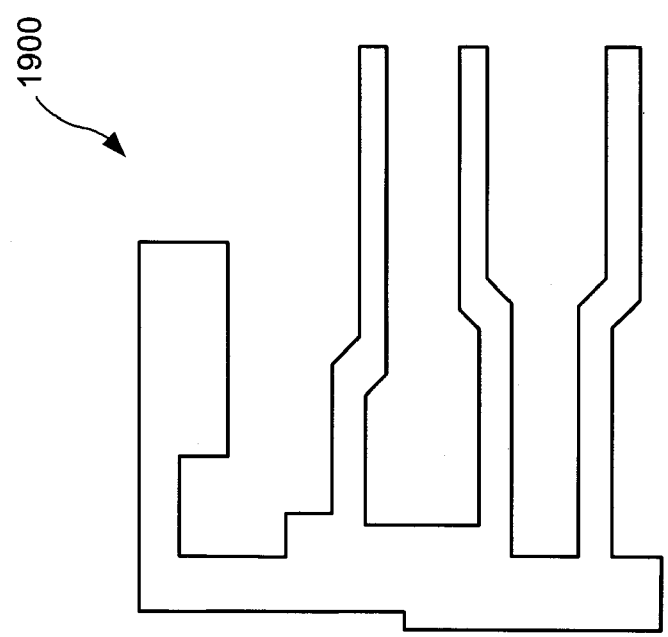
Figure 19D:
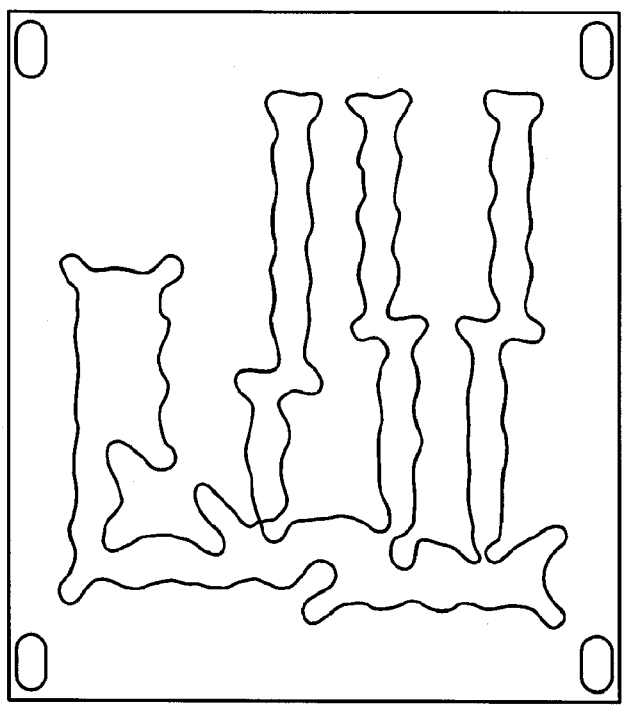
Figure 19C:
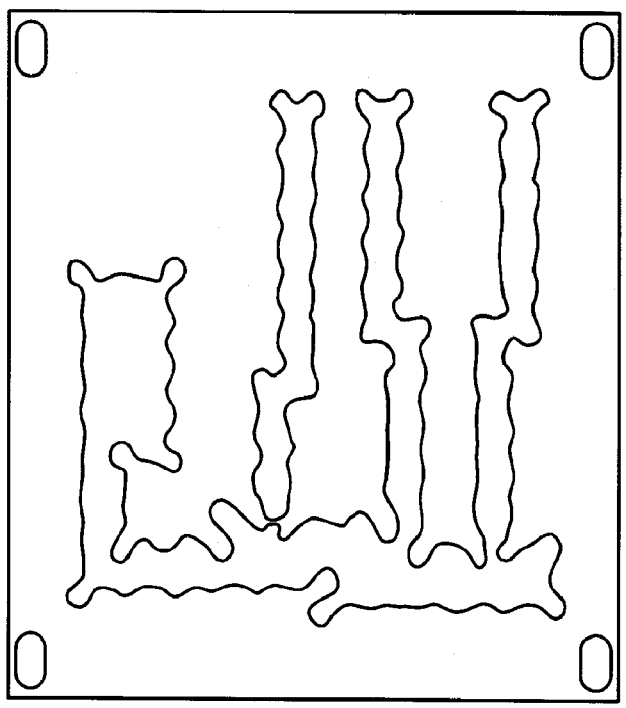
Figure 19F:
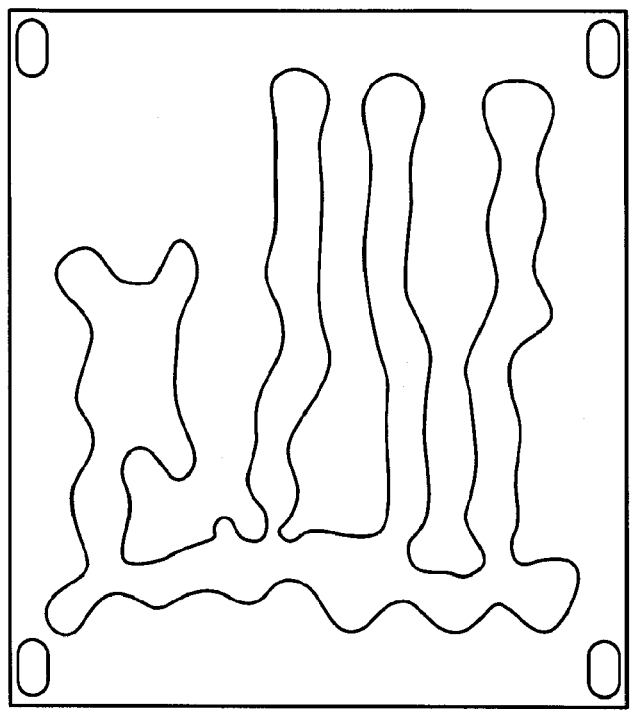
Figure 19E:
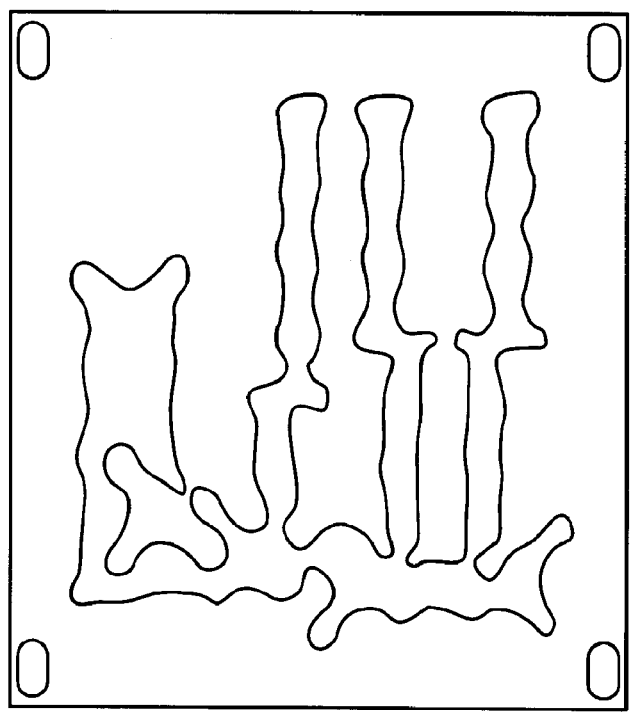

FIG. 19A shows an example target pattern 1900. FIGS. 19B, C, D, E and F show sample mask patterns for this target pattern using different process parameters. While the target pattern 1900 is shown as the same for each process, it will be understood that the target pattern may be scaled to a different size for each of the processes. FIG. 19B shows the mask pattern for a binary chrome and glass mask, 130 nm design rules, 193 nm illumination wavelength, numerical aperture of 0.7 and annular illumination. FIG. 19C shows the mask pattern for a binary chrome and glass mask, 100 nm design rules, 193 nm illumination wavelength, numerical aperture of 0.7 and annular illumination. FIG. 19D shows the mask pattern for a binary chrome and glass mask, 80 nm run design rules, 193 nm illumination wavelength, numerical aperture of 0.7 and annular illumination. FIG. 19E shows the mask pattern for a binary chrome and glass mask, 65 nm design rules, 193 nm illumination wavelength, numerical aperture of 0.7 and annular illumination. FIG. 19F shows the mask pattern for a binary chrome and glass mask, 45 nm design rules, 193 nm illumination wavelength, numerical aperture of 0.7 and annular illumination.

Figure 20B:
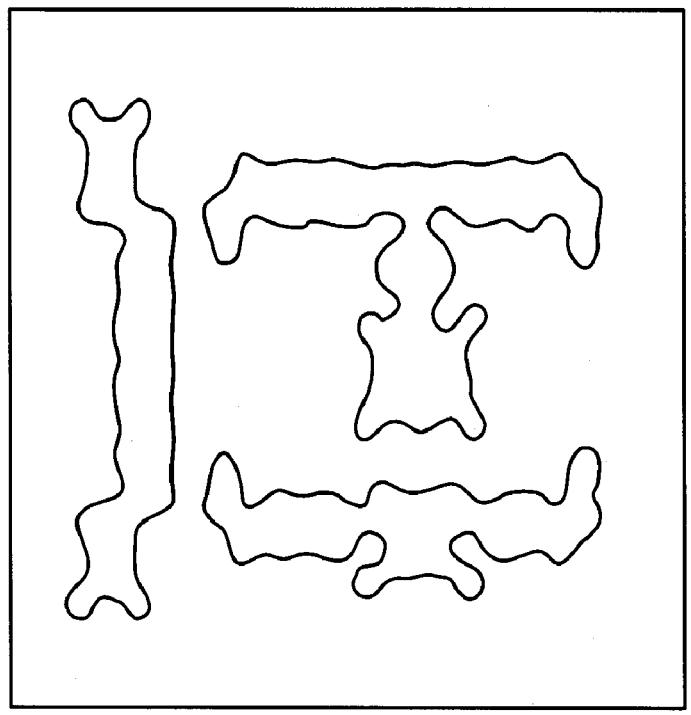
FIG. 20A is a diagram illustrating a wafer pattern and FIGS. 20B, C, D and E illustrate photomask patterns for producing the wafer pattern, according to an embodiment of the present invention.
Figure 20A:
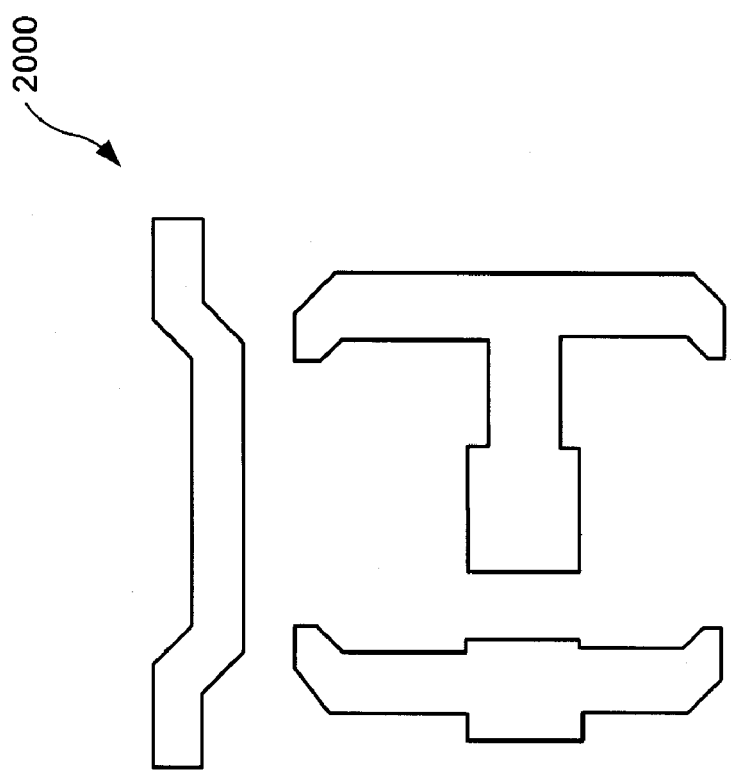
Figure 20D:
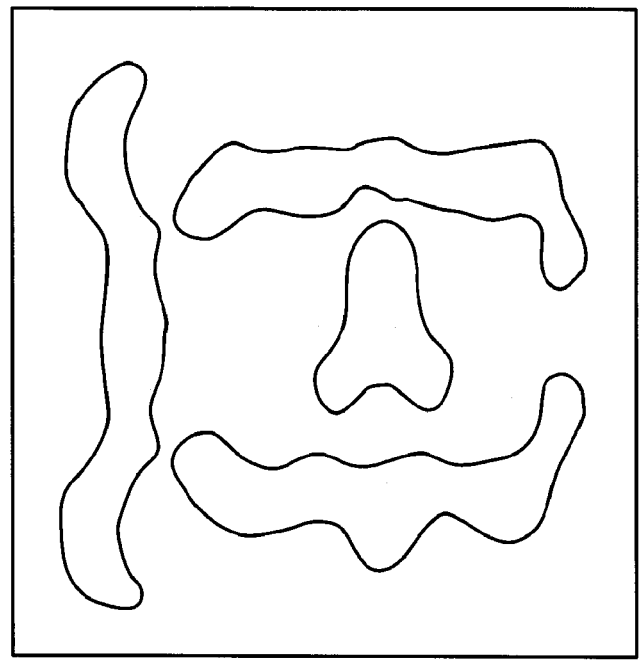
Figure 20C:
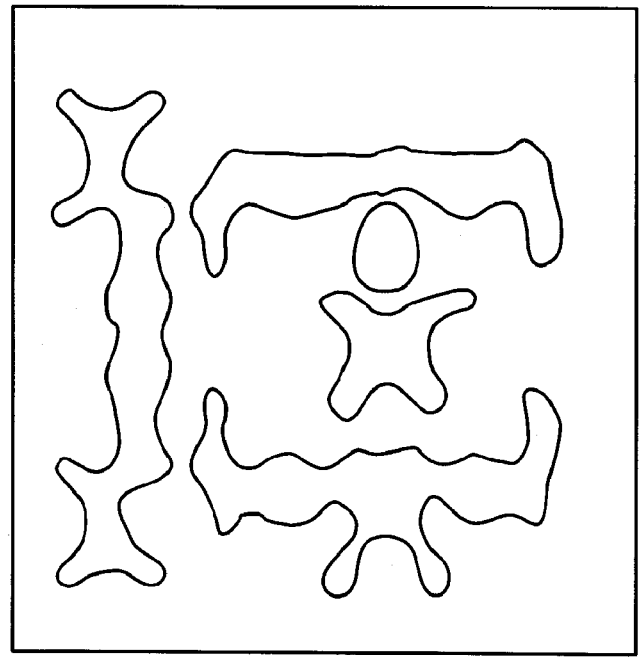
Figure 20E:
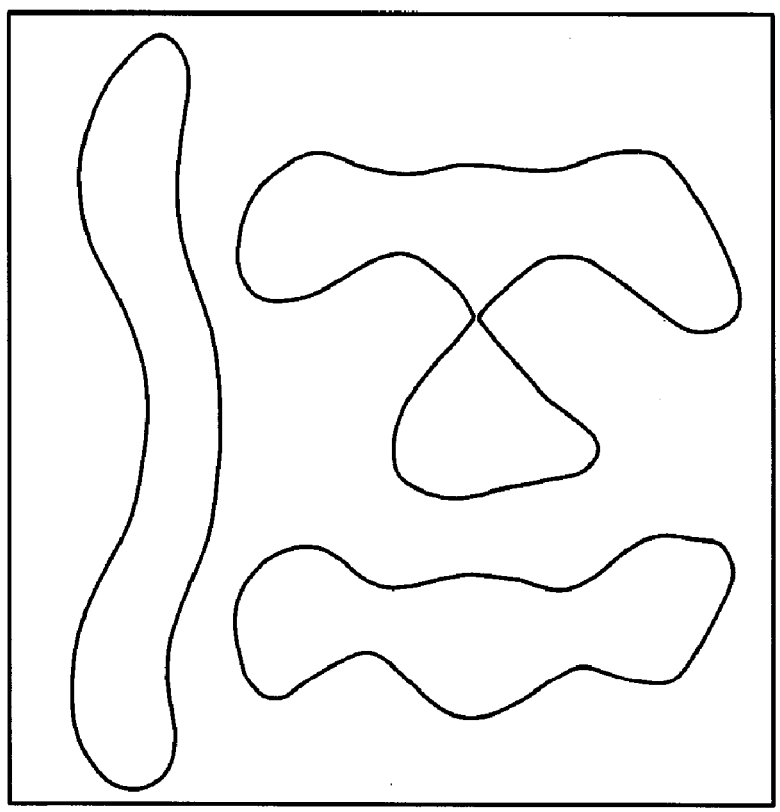

FIG. 20A shows an example target pattern 2000. FIGS. 19B, C, D and E show sample mask patterns for this target pattern using different process parameters. While the target pattern 2000 is shown as the same for each process, it will be understood that the target pattern may be scaled to a different size for each of the processes. FIG. 20B shows the mask pattern for a binary chrome and glass mask, 130 nm design rules, 193 nm illumination wavelength, numerical aperture of 0.7 and annular illumination. FIG. 20C shows the mask pattern for a binary chrome and glass mask, 90 run design rules, 193 nm illumination wavelength, numerical aperture of 0.7 and annular illumination. FIG. 20D shows the mask pattern for a binary chrome and glass mask, 65 nm design rules, 193 nm illumination wavelength, numerical aperture of 0.7 and annular illumination. FIG. 20E shows the mask pattern for a binary chrome and glass mask, 45 nm design rules, 193 nm illumination wavelength, numerical aperture of 0.7 and annular illumination.

In example embodiments, photomasks may be used to manufacture integrated circuit devices or other workpieces using masks having patterns determined by any of the methods described above. These masks may be used in lithography equipment to develop a pattern in photoresist on a semiconductor wafer or other workpiece. Processing equipment may then be used for etching, doping or depositing materials based in such regions to form integrated circuits or other structures. Photoresist may be stripped and additional layers may be formed by repeating the above steps with a photomask for the additional layers. Processed wafers or other workpieces may then be scribed into die and packaged to form integrated circuit devices or other devices.

Other Variations

Aspects of the present invention may be applied to solving for an optimal grayscale or continuous tone photomask. Aspects of the invention may also be applied to maskless optical lithography, as well as optical mask writers. In these embodiments, instead of solving for the "optimal photomask", one would merely solve for the optimal pattern to be used in controlling the maskless optical lithography tool or optical mask writing tool.

Various elements and steps in the description and example embodiments above may be applied independently or in various combinations. For example, a variety of methods for finding the optimal photomask may be used in combination with aspects described above, including but not limited to the method of Nashold projections, variations of Fienap phase-retrieval algorithms, coherent approximation with deconvolution, local variations, descent searches, linear and nonlinear programming, pixel flipping, quadratic optimization, linear and nonlinear least squares, Gerchberg-Saxton algorithm, simulated annealing, genetic algorithms. Aspects of the present invention which can be applied to such methods may be so applied within the scope of the invention. For example, these methods may be used in combination with one or more of the following aspects described above: any of the above merit functions, any of the above pattern representations and associated conversion methods, any of the above parallel processing techniques including but not limited to dividing a pattern or file into blocks with halos for parallel processing, or other aspects of the embodiments described above. For example, the parallel system architecture described previously may be applied to a variety of photomask optimization methods. Elements of the Hamiltonian function described above may also be applied to a variety of optimization methods which can make use of a merit function. Other means of combining various aspects of the present invention with other optimization methods are also possible.

Accordingly, while there have been shown and described above various alternative embodiments of systems and methods of operation for the purpose of enabling a person of ordinary skill in the art to make and use the invention, it should be appreciated that the invention is not limited thereto. Accordingly, any modifications, variations or equivalent arrangements within the scope of the attached claims should be considered to be within the scope of the invention. In addition, the foregoing description of the principles of our invention is by way of illustration only and not by way of limitation. For example, although several illustrative embodiments of methodologies in accordance with the principles of our invention have been shown and described, other alternative embodiments are possible and would be clear to one skilled in the art upon an understanding of the principles of our invention. For example, several alternatives have been described for various steps described in this specification. It should be understood that one alternative is not disjoint from another alternative and that combinations of the alternatives may be employed in practicing the subject matter of the claims of this disclosure. Certainly the principles of our invention have utility apart from making photomasks for integrated circuits, some of which we have already mentioned. Accordingly, the scope of our invention is to be limited only by the appended claims.

Foregoing described embodiments of the invention are provided as illustrations and descriptions. They are not intended to limit the invention to precise form described.

In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A computer-implemented method for determining a mask pattern to be used on a photo-mask in a photolithographic process, wherein the photo-mask has a plurality of distinct types of regions having distinct optical properties, comprising:
    partitioning a target pattern into subsets of the target pattern;
    distributing the subsets of the target pattern to a plurality of processors; and
    determining a set of second mask patterns each of which corresponding to one of the subsets of the target pattern, wherein at least one of the second set of mask patterns is determined by performing operations including:
        providing a first mask pattern that includes a plurality of distinct types of regions corresponding to the distinct types of regions of the photo-mask;
        calculating, by a computer, a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and
        determining a second mask pattern based, at least in part, on the gradient.

2. The computer-implemented method of claim 1, wherein the operations performed on at least some of the second mask patterns are performed independent of each other.

3. The computer-implemented method of claim 1, wherein the operations for at least two of the second mask patterns are performed concurrently.

4. The computer-implemented method of claim 1, wherein at least a portion of respective adjacent subsets of the target pattern overlap each other.

5. The computer-implemented method of claim 4, wherein the overlap is within the range of 0.5 to 2 microns.

6. The computer-implemented method of claim 1, wherein a size of at least some of the subsets of the target pattern is less than 100 $\mu m^2$.

7. The computer-implemented method of claim 1, wherein a size of at least some of the subsets of the target pattern is less than 1000 $\mu m^2$.

8. The computer-implemented method of claim 1, wherein a size of at least some of the subsets of the target pattern is greater than 10000 $\mu m^2$.

9. The computer-implemented method of claim 1, further comprising combining a set of second mask patterns to produce a third mask pattern.

10. A computer-program product for use in conjunction with a computer system, the computer-program product comprising a computer-readable storage medium and a computer-program mechanism embedded therein for determining a mask pattern to be used on a photo-mask in a photolithographic process, wherein the photo-mask has a plurality of distinct types of regions having distinct optical properties, the computer-program mechanism including:
    instructions for partitioning a target pattern into subsets of the target pattern;
    instructions for distributing the subsets of the target pattern to a plurality of processors; and
    instructions for determining a set of second mask patterns each of which corresponding to one of the subsets of the target pattern, wherein at least one of the second set of mask patterns is determined by performing operations including:
        instructions for providing a first mask pattern that includes a plurality of distinct types of regions corresponding to the distinct types of regions of the photo-mask;
        instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and
    instructions for determining a second mask pattern based, at least in part, on the gradient.

11. A computer system, comprising:
    at least one processor;
    at least one memory; and
    at least one program module, the program module stored in the memory and configured to be executed by the processor, wherein at least the program module is for determining a mask pattern to be used on a photo-mask in a photolithographic process, and wherein the photo-mask has a plurality of distinct types of regions having distinct optical properties, at least the program module mechanism including:
    instructions for partitioning a target pattern into subsets of the target pattern;
    instructions for distributing the subsets of the target pattern to a plurality of processors; and
    instructions for determining a set of second mask patterns each of which corresponding to one of the subsets of the target pattern, wherein at least one of the second set of mask patterns is determined by performing operations including:
        instructions for providing a first mask pattern that includes a plurality of distinct types of regions corresponding to the distinct types of regions of the photo-mask;
        instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and instructions for determining a second mask pattern based, at least in part, on the gradient.

12. A computer system, comprising:
means for computing;
means for storing; and
at least one program module mechanism, the program module mechanism stored in at least the means for storing and configured to be executed by at least the means for computing, wherein at least the program module is for determining a mask pattern to be used on a photo-mask in a photolithographic process, and wherein the photo-mask has a plurality of distinct types of regions having distinct optical properties, at least the program module mechanism including:
instructions for partitioning a target pattern into subsets of the target pattern;
instructions for distributing the subsets of the target pattern to a plurality of processors; and
instructions for determining a set of second mask patterns each of which corresponding to one of the subsets of the target pattern, wherein at least one of the second set of mask patterns is determined by performing operations including:
instructions for providing a first mask pattern that includes a plurality of distinct types of regions corresponding to the distinct types of regions of the photo-mask;
instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and
instructions for determining a second mask pattern based, at least in part, on the gradient.

13. A computer-implemented method for determining a pattern to be used in a maskless lithography process, comprising:
calculating, by a computer, a gradient of a function, wherein the function depends, at least in part, upon a model of the maskless lithographic process, and wherein the gradient is calculated in accordance with a formula obtained by taking a derivative of the function; and
generating a pattern based, at least in part, on the gradient of the function.

14. The computer-implemented method of claim 13, wherein the function further depends upon a target pattern, wherein the target pattern is represented with a resolution finer than a pixel size used in calculating the gradient.

15. The computer-implemented method of claim 13, wherein the model of the maskless lithography process includes out of focus conditions.

16. The computer-implemented method of claim 13, wherein the function is a merit function that indicates a degree of desirability of the pattern.

17. The computer-implemented method of claim 13, wherein the model of the maskless lithographic process includes a resist model.

18. A computer-implemented method for determining a mask pattern to be used on a photo-mask in a photolithographic process, wherein the photo-mask has a plurality of distinct types of regions having distinct optical properties, comprising:
converting a first format of a target pattern into a second format, wherein the second format includes a pixel-based based representation;
providing a first mask pattern that includes a plurality of distinct types of regions corresponding to the distinct types of regions of the photo-mask, wherein the first mask pattern corresponds to at least a portion of the target pattern;
calculating, by a computer, a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and
determining a second mask pattern based, at least in part, on the gradient.

19. The computer-implemented method of claim 18, further comprising converting the second mask pattern into a third format, wherein the third format specifies features in the second mask pattern with a finer resolution than a pixel size of the second mask pattern.

20. The computer-implemented method of claim 19, wherein the features include positions of edges in the second mask pattern.

21. A computer system, comprising:
at least one processor;
at least one memory; and
at least one program module, the program module stored in the memory and configured to be executed by the processor, wherein at least the program module is for determining a mask pattern to be used on a photo-mask in a photolithographic process, and wherein the photo-mask has a plurality of distinct types of regions having distinct optical properties, at least the program module mechanism including:
instructions for converting a first format of a target pattern into a second format, wherein the second format includes a pixel-based representation;
instructions for providing a first mask pattern that includes a plurality of distinct types of regions corresponding to the distinct types of regions of the photo-mask, wherein the first mask pattern corresponds to at least a portion of the target pattern;
instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and
instructions for determining a second mask pattern based, at least in part, on the gradient.

22. A computer system, comprising:
at least one processor;
at least one memory; and
at least one program module, the program module stored in the memory and configured to be executed by the processor, wherein at least the program module is for determining a mask pattern to be used on a photo-mask in a photolithographic process, and wherein the photo-mask has a plurality of distinct types of regions having distinct optical properties, at least the program module mechanism including:

instructions for providing a first mask pattern that includes a plurality of distinct types of regions corresponding to the distinct types of regions of the photo-mask;

instructions for determining a first function corresponding to the first mask pattern, wherein a range of the first function has a cardinality that is greater than a number of distinct types of regions of the first mask pattern, a domain of the first function corresponds to a plane of the first mask pattern, and wherein values of the first function indicate locations of boundaries between the distinct types of regions in the first mask pattern with a finer resolution than corresponding location in the plane of the first mask pattern; and instructions for generating a second function based, at least in part, on the first function, wherein the second function corresponds to a second mask pattern.

23. A computer-implemented method for determining a mask pattern to be used on a photo-mask in a photolithographic process, wherein the photo-mask has a plurality of distinct types of regions having distinct optical properties, comprising:

providing a first mask pattern that includes a plurality of distinct types of regions corresponding to the distinct types of regions of the photo-mask;

determining, by a computer, a first function corresponding to the first mask pattern, wherein a range of the first function has a cardinality that is greater than a number of distinct types of regions of the first mask pattern, a domain of the first function corresponds to a plane of the first mask pattern, and wherein values of the first function indicate locations of boundaries between the distinct types of regions in the first mask pattern with a finer resolution than corresponding location in the plane of the first mask pattern; and generating a second function based, at least in part, on the first function, wherein the second function corresponds to a second mask pattern.

24. The computer-implemented method of claim 23, further comprising extracting the second mask pattern from the second function.

* * * * *